(12) United States Patent
Kitsunezuka

(10) Patent No.: US 9,036,390 B2
(45) Date of Patent: May 19, 2015

(54) FREQUENCY CONVERTER THAT SUPPRESSES CROSSTALK THAT OCCURS BETWEEN A LOCAL OSCILLATION SIGNAL AND A RECEIVED SIGNAL, AND RECEIVER THAT USES THE FREQUENCY CONVERTER

(75) Inventor: Masaki Kitsunezuka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 249 days.

(21) Appl. No.: 13/806,570

(22) PCT Filed: Apr. 14, 2011

(86) PCT No.: PCT/JP2011/059235
§ 371 (c)(1),
(2), (4) Date: Dec. 21, 2012

(87) PCT Pub. No.: WO2012/002023
PCT Pub. Date: Jan. 5, 2012

(65) Prior Publication Data
US 2013/0094270 A1  Apr. 18, 2013

(30) Foreign Application Priority Data
Jun. 29, 2010  (JP) .................................. 2010-147496

(51) Int. Cl.
*H02M 5/45* (2006.01)
*H02M 5/02* (2006.01)
*H03D 7/16* (2006.01)

(52) U.S. Cl.
CPC ................ *H02M 5/02* (2013.01); *H03D 7/163* (2013.01); *H03D 2200/0084* (2013.01)

(58) Field of Classification Search
USPC ................. 363/152, 153, 127, 132, 157, 159, 363/162–165, 167, 170–173, 176, 177; 455/302, 296, 303–306
See application file for complete search history.

(56) References Cited

U.S. PATENT DOCUMENTS

| | | | | |
|---|---|---|---|---|
| 3,991,419 | A | * | 11/1976 | Thomas .................... 455/306 |
| 6,636,730 | B2 | * | 10/2003 | Spargo et al. ............. 455/302 |
| 2004/0142673 | A1 | | 7/2004 | Asayama et al. |
| 2006/0274215 | A1 | | 12/2006 | Tseng et al. |
| 2010/0003943 | A1 | | 1/2010 | Seendripu et al. |

FOREIGN PATENT DOCUMENTS

| | | | |
|---|---|---|---|
| JP | 2001298327 A | 10/2001 | |
| JP | 2002198847 A | 7/2002 | |

(Continued)

OTHER PUBLICATIONS

The international search report for PCT/JP2011/059235 mailed on Jul. 5, 2011.

(Continued)

*Primary Examiner* — Adolf Berhane
*Assistant Examiner* — Nusrat Quddus
(74) *Attorney, Agent, or Firm* — Sughrue Mion, PLLC

(57) ABSTRACT

The present invention is applied to a frequency converter used for a receiver. The frequency converter according to the present invention includes an LO signal generator (11) that generates an LO signal and outputs the LO signal; and a mixer (10) that multiplies a received signal that has been band-limited to a usable bandwidth of said receiver by the LO signal so as to convert the frequency of the received signal and outputs the resultant signal. Said LO signal generator is capable of varying a phase resolution.

9 Claims, 23 Drawing Sheets

(56) References Cited

FOREIGN PATENT DOCUMENTS

| JP | 2004179841 A | 6/2004 |
|----|--------------|--------|
| JP | 2006345473 A | 12/2006 |
| JP | 2007017650 A | 1/2007 |
| JP | 2008523734 A | 7/2008 |
| JP | 2009273102 A | 11/2009 |

OTHER PUBLICATIONS

S. Lerstaveesin, et al., "A 48-860 MHz CMOS Low-IF Direct-Conversion DTV Tuner," IEEE J. Solid-State Circuits, vol. 43, No. 9, pp. 2013-2024, Sep. 2008.

Z. Ru, et al., "A Software-Defined Radio Receiver Architecture Robust to Out-of-Band Interference," in IEEE ISSCC Dig. Tech. Papers, 2009, pp. 230-231.

* cited by examiner

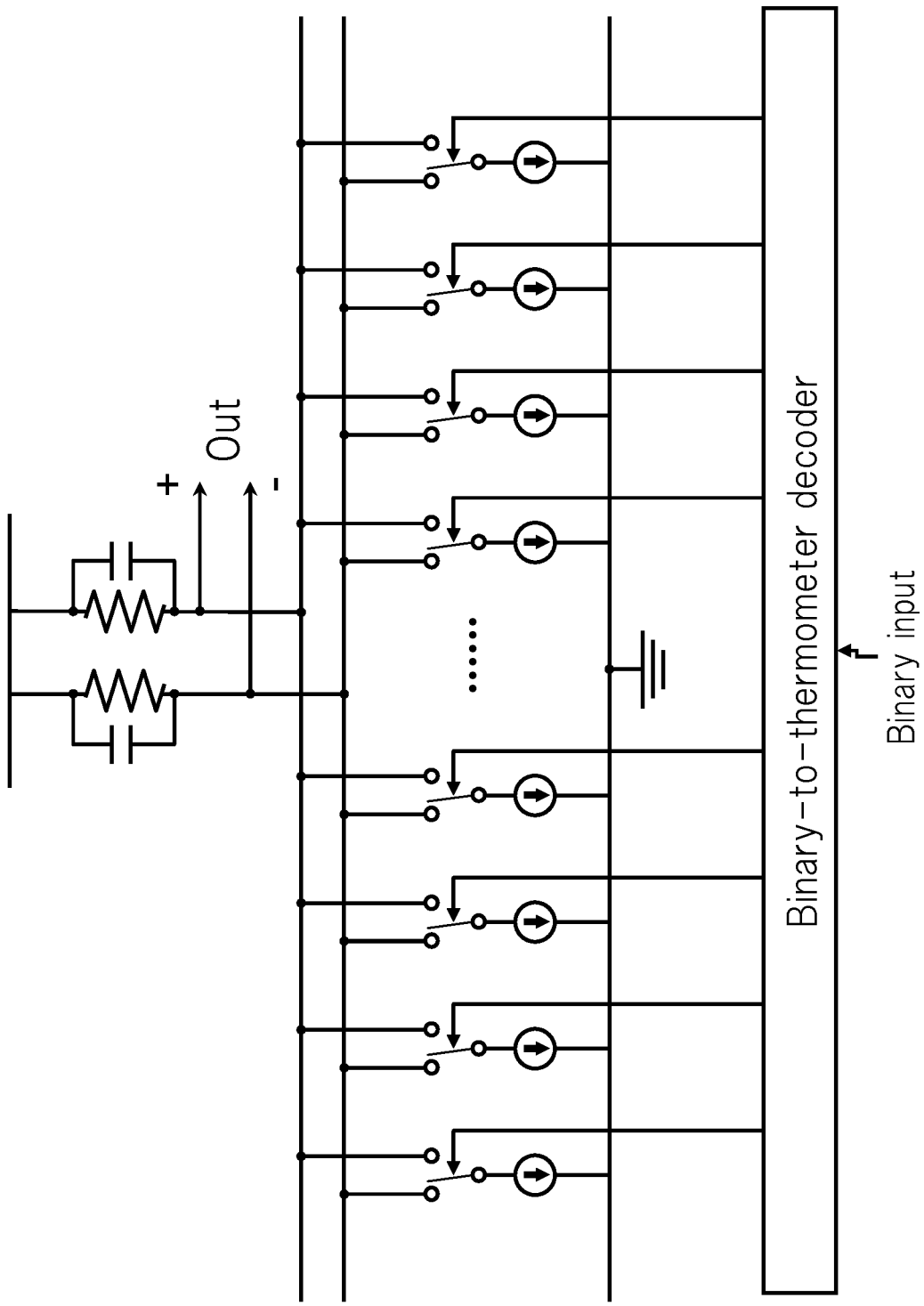

discrete LO signal

FREQUENCY CONVERTER THAT SUPPRESSES CROSSTALK THAT OCCURS BETWEEN A LOCAL OSCILLATION SIGNAL AND A RECEIVED SIGNAL, AND RECEIVER THAT USES THE FREQUENCY CONVERTER

This application is a National Stage Entry of PCT/JP2011/059235 filed Apr. 14, 2011, which claims priority from Japanese Patent Application 2010-147496 filed Jun. 29, 2010, the contents of all of which are incorporated herein by reference, in their entirety.

TECHNICAL FIELD

The present invention relates to a frequency converter and a receiver that uses the frequency converter, in particular, to a frequency converter that suppresses crosstalk that occurs between interference signals of harmonics of a local oscillation (LO) signal and a received signal and to a receiver that users the frequency converter.

BACKGROUND ART

In recent years, software-defined radios that use general-purpose hardware and that can switch between radio communication standards that only correspond to settings on software have been actively studied and developed. Software-defined radios need to deal with radio frequencies from several 10 MHz to several GHz that are generally used.

FIG. 1A shows the structure of a receiver disclosed in Non-Patent Literature 1 as an example of a receiver that receives RF (Radio Frequency) signals. In this receiver, a received RF signal is input through an antenna to an RF circuit composed of band pass filter 160, low noise amplifier (LNA) 161, RF tracking filter 162, and frequency converter 163. Band pass filter 160 eliminates interference signals that lie in an unnecessary bandwidth from the received RF signal so as to prevent the downstream circuits from getting saturated (however, in this case, band pass filter 160 cannot eliminate interference signals having frequencies in the neighborhood of the frequency of the desired signal). The received RF signal that passes through band pass filter 160 is amplified by LNA 161. After RF tracking filter 162 further suppresses the remaining interference signals, frequency converter 163 converts the frequency of the received RF signal using a clock signal generated by clock generator 164, and then a baseband section performs signal processes such as filtering for the resultant signal.

From a point of view of cost and the size of circuit area for software-defined radios, it is not preferred that components that differ in characteristics be implemented and switched between applicable radio communication standards. In particular, reducing of the number of band pass filters that are integrated in a chip is difficult and has become a critical technical issue in order to accomplish software-defined radios. To reduce the number of band pass filters, a technique that allows the pass bandwidth of a band pass filter to become variable or another technique that allows signals having frequencies of several 10 MHz to several GHz to pass might be contemplated. On the other hand, band pass filters located upstream of the LNA need to satisfy both high linearity and low noise characteristics. Although passive filters such as surface acoustic filters (SAWs) excellently satisfy such characteristics, it is difficult to adjust the pass bandwidth of passive filters.

Thus, in receivers applicable for software-defined radios, SAW filters that have wide pass bandwidths might be a hopeful candidate for band pass filters. However, in this case, depending on the frequency of a desired signal, interference signals having frequencies up to 10 times higher than the frequency of the desired signal can be input to the LNA and the frequency converter. Ideally, a frequency converter uses a mixer that multiplies the received RF signal by the LO signal and outputs signals of which an addition and a subtraction for the frequency of the received RF signal and the frequency of the LO signal are performed. However, actually, because of harmonics of the LO signal and nonlinearity of the mixer, the frequency converter also converts the frequencies of interference signals other than the desired signal. In particular, if the LO frequency of the LO signal is low, it is difficult to transfer the LO signal that is a sine wave. Rather, it is preferable that the LO signal that is a square wave be transferred from the point of view of the size of circuit area and power consumption. However, since an LO signal that is a square wave contains many odd-order harmonics, crosstalk with the received RF signal has become a critical problem (even-order harmonics can be eliminated using a differential circuit structure).

The receiver disclosed in Non-Patent Literature 1 uses both a mixer (FIG. 1B) called harmonics eliminating mixer located in frequency converter 163 and RF tracking filter 162 in order to solve the foregoing problem. The harmonics eliminating mixer uses a three-phase square LO signal having phases that vary by 45 degrees each. For example, base band I signal having a phase of 0 degree is obtained by multiplying the received RF signal by an LO signal having phases of −45 degrees, 0 degree, and 45 degrees, weighting the results with gains of 1, √2, and 1, respectively, and adding the results. Base band signal having a phase of 90 degrees can be obtained by multiplying the received RF signal by an LO signal having phases of 45 degrees, 90 degrees, and 135 degrees, respectively, weighting them with the foregoing gains, and adding the results. Likewise, inverted signals of base band I signal and base band Q signal can be obtained by using an LO signal having phases of 135 degrees, 180 degrees, and 225 degrees and an LO signal having phases of 225 degrees, 270 degrees, and 315 degrees, respectively. In other words, to demodulate base band I signal and base band Q signal, an LO signal having a total of eight phases that vary by 45 degrees each is used. By weighting an LO signal having phases that vary by 45 degrees each and adding the results, the frequency conversion using an LO signal that approximates a pseudo-sine wave, although it is actually a square LO single, can be performed (FIG. 2). Since the third-order and fifth-order harmonics of the artificial sine wave are 0, crosstalk between interference signals having these frequencies and the received signal can be eliminated.

As another example as disclosed in Non-Patent Literature 2, FIG. 3 shows the structure of a receiver that does not use an RF tracking filter. In this receiver, mixer 182 uses an LO signal having a total of eight phases that vary by 45 degrees each so as to prevent crosstalk between interference signals of the third-order and fifth-order harmonics and the received signal like Non-Patent Literature 1. The receiver disclosed in Non-Patent Literature 2 is different from the receiver disclosed in Non-Patent Literature 1 in that instead of an RF tracking filter, two types of band pass filters 180 and 184 are used and channel pass filter 188 switches from one band selection filter to another corresponding to the frequency of a desired signal. The receiver disclosed in Non-Patent Literature 2 has LNA 181, mixer 182, and 8-phase clock generator 183 that corresponds to band pass filter 180; and LNA 185, mixer 186, and 4-phase clock generator 187 that corresponds to band pass filter 184. For example, in the case that the bandwidth of band pass filter 180 ranges from 0.4~2.5 GHz and the bandwidth of band pass filter 184 ranges from 2.5~6

GHz, if the frequency of the desired signal is 0.4 GHz, band pass filter 180 is used. Since the frequency seven times higher than 0.4 GHz is 2.8 GHz, an interference signal of the seven-order harmonic of an LO signal can be eliminated by band pass filter 180.

RELATED ART LITERATURE

Non-Patent Literature

Non-Patent Literature 1: S. Lerstaveesin, et al., "A 48-860 MHz CMOS Low-IF Direct-Conversion DTV Tuner," IEEE J. Solid-State Circuits, vol. 43, no. 9, pp. 2013-2024, September 2008.

Non-Patent Literature 2: Z. Ru, et al., "A Software-Defined Radio Receiver Architecture Robust to Out-of-Band Interference," in IEEE ISSCC Dig. Tech. Papers, 2009, pp. 230-231.

SUMMARY OF THE INVENTION

Problem to be Solved by the Invention

However, the receiver disclosed in Non-Patent Literature 1 has several problems.

As a first problem, even if the frequency of the desired signal is low and crosstalk between an interference signal of the seventh-order harmonic of an LO signal and the received signal occurs, it cannot be suppressed. To solve such a problem, an RF tracking filter whose center frequency matches the frequency of the desired signal is located upstream of the frequency converter so as to eliminate an interference signal having the frequency of the seventh-order harmonic of the LO signal. However, if passive filters are used for the RF tracking filter, their size of circuit area might become a problem; if active filters are used for the RF tracking filter, their power consumption might become a problem.

As a second problem, if the frequency of the desired signal is relatively high and an interference signal of the third-order harmonic of the LO signal has been eliminated by an upstream band pass filter, a harmonics eliminating mixer using an LO signal having eight phases is rather unnecessary because the generation of multi-phase LO signal and the operation of the RF tracking filter waste power.

The receiver disclosed in Non-Patent Literature 2 also has a problem in which, if the frequency of the desired signal becomes as high as several 10 MHz, the receiver needs more band pass filters.

Thus, an object of the present invention is to provide a frequency converter that can suppress crosstalk between interference signals including the seventh or higher order harmonics of an LO signal and a received signal regardless of the frequency of a desired signal while it satisfies requirements for reduced the size of circuit area and reduced power consumption.

Another object of the present invention is to provide a receiver that can suppress crosstalk between interference signals of harmonics of an LO signal and a received signal without it being necessary to use both an RF tracking filter and two or more band pass filters while satisfying requirements for reducing the size of circuit area and for reducing power consumption.

Means that Solve the Problem

A frequency converter according to the present invention is a frequency converter used for a receiver, including:
an LO signal generator that generates an LO signal and outputs the LO signal; and a mixer that multiplies a received signal that has been band-limited to a usable bandwidth of said receiver by the LO signal so as to convert the frequency of the received signal and that outputs the resultant signal,
wherein said LO signal generator is capable of varying a phase resolution.

A receiver according to the present invention is a receiver, including: a frequency converter as set forth in any one of claims 1 to 9; and
a band pass filter that is located upstream of said frequency converter and that limits the bandwidth of the received signal to said usable bandwidth.

Effect of the Invention

A frequency converter according to the present invention has an LO signal generator and a mixer that multiplies a received signal band-limited to the usable bandwidth of a receiver by an LO signal, converts the frequency of the received signal, and outputs the resultant signal. The frequency converter can vary the phase resolution of the LO signal generator.

Thus, even if the LO frequency is low, since harmonics of the LO signal in the usable bandwidth of the receiver can be eliminated, as an effect of the present invention, crosstalk between interference signals of harmonics of the LO signal and the received signal can be eliminated without it being necessary to use an RF tracking filter that requires large the size of circuit area and high power consumption or without it being necessary to switch from one of a plurality of band pass filters to another.

If the LO frequency is relatively high and an interference signal of for example the third-order harmonic of the LO signal has been eliminated, since a coarse resolution of the LO signal can be designated and the LO signal can be generated with the minimum phase resolution, as an effect of the present invention, the power consumption can be reduced.

BRIEF DESCRIPTION OF DRAWINGS

FIG. 9 is a schematic diagram exemplifying specific structures of circuits of a DAC and an LPF according to the first exemplary embodiment of the present invention.

BEST MODES THAT CARRY OUT THE INVENTION

Figure 1A:
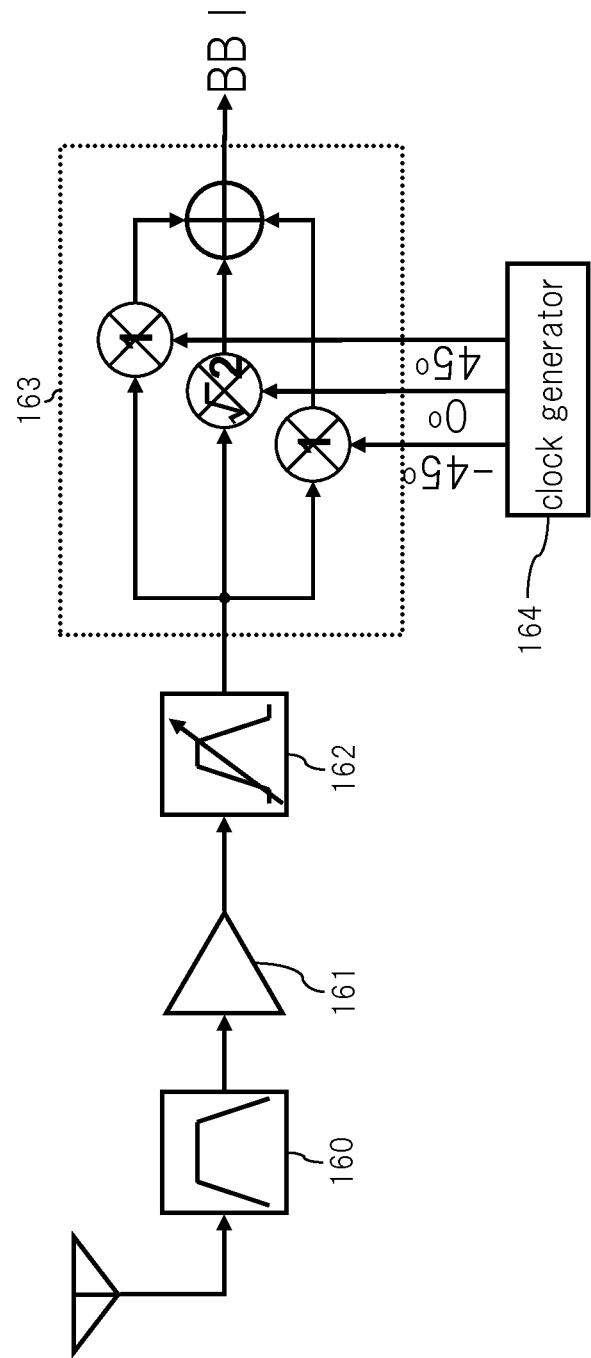
FIG. 1A is a schematic diagram showing the structure of a receiver disclosed in Non-Patent Literature 1.
Figure 1B:
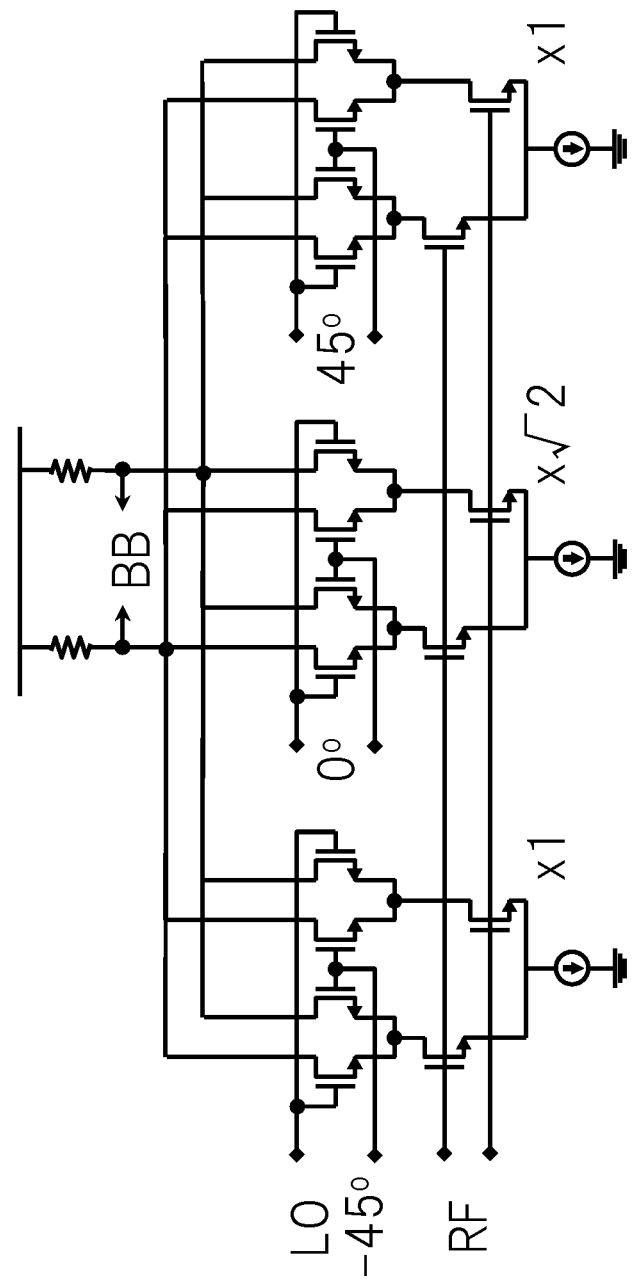
FIG. 1B is a schematic diagram showing the structure of a frequency converter disclosed in Non-Patent Literature 1.
Figure 2:
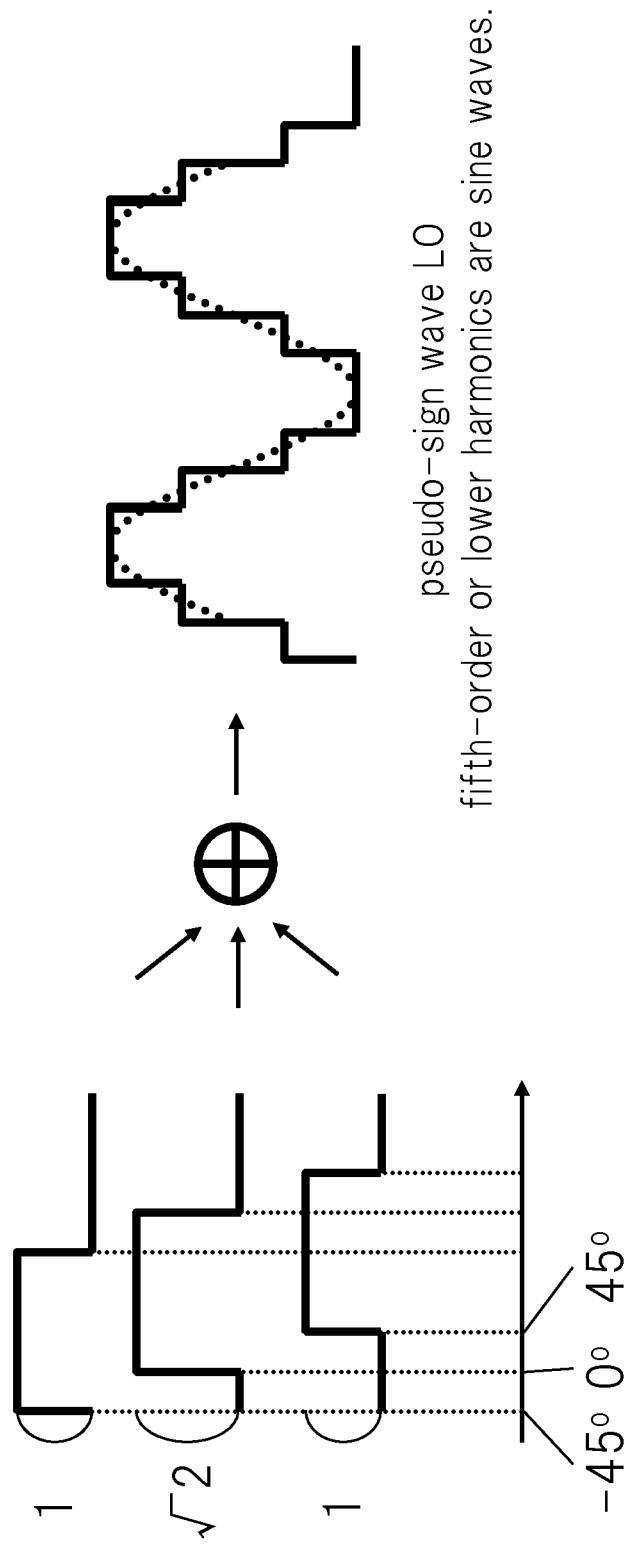
FIG. 2 is a schematic diagram showing a waveform of a signal that is output from the frequency converter disclosed in Non-Patent Literature 1.
Figure 3:
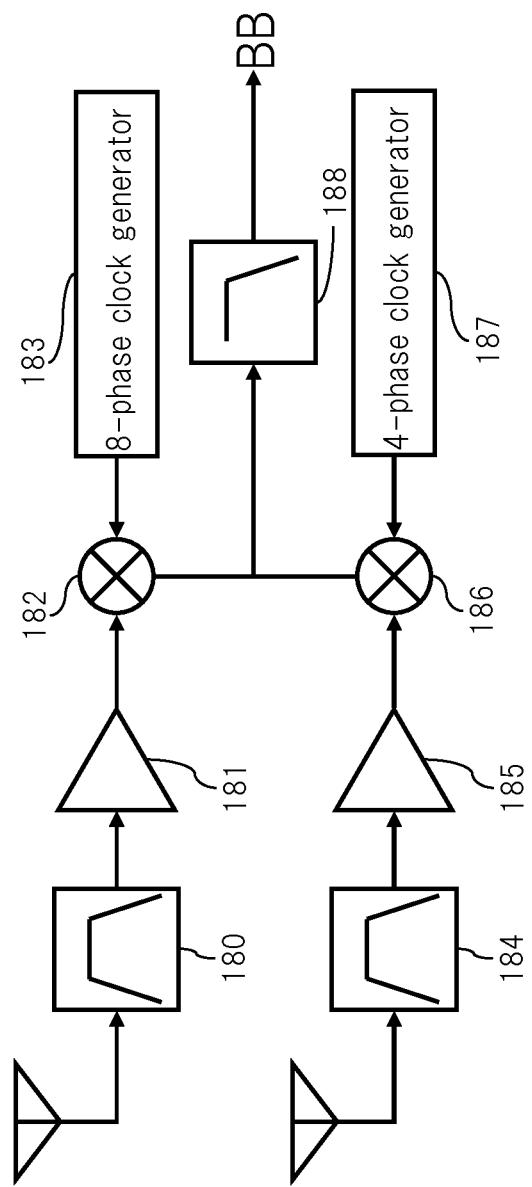
FIG. 3 is a schematic diagram showing the structure of a receiver disclosed in Non-Patent Literature 2.

Next, with reference to the accompanying drawings, exemplary embodiments of the present invention will be described in detail. In all the accompanying drawings, similar structural elements are denoted by similar reference numerals and their description will be omitted.

(1) First Exemplary Embodiment

Figure 4:
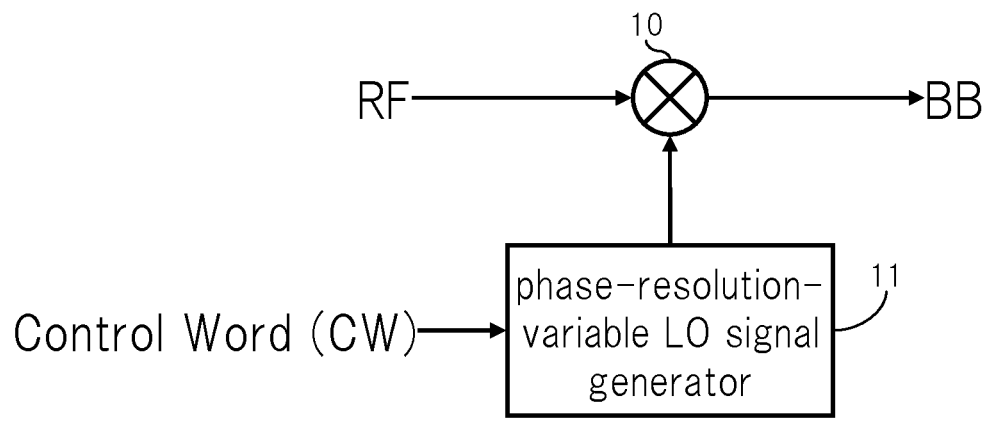
FIG. 4 is a schematic diagram showing the structure of a frequency converter according to a first exemplary embodiment of the present invention.

FIG. 4 shows the structure of a frequency converter according to a first exemplary embodiment of the present invention. The frequency converter according to this exemplary embodiment has mixer 10 and phase-resolution-variable LO signal generator 11 (hereinafter simply referred to as "LO signal generator" 11).

The frequency converter according to this exemplary embodiment is a fundamental circuit that consists of an ordinary receiver. The bandwidth of a received RF signal that is input to mixer 10 has been limited in the usable bandwidth of the receiver by an upstream band pass filter (not shown) such as a SAW filter such that the filter has eliminated interference signals that lie out of the usable bandwidth of the receiver.

Mixer 10 multiplies the received RF signal that has been band-limited in the foregoing manner by an orthogonal LO signal that is output from LO signal generator 11 so as to convert the frequency of the received RF signal to orthogonal base band signals (base band I signal and base band Q signal).

LO signal generator 11 can vary a phase resolution and generate and output orthogonal LO signals that have waveforms representing a cosine wave and a sine wave with a phase resolution in which no harmonics occur in the usable bandwidth of the receiver. Control word CW that is input to LO signal generator 11 corresponds to a control signal that serves to vary the phase resolution of LO signal generator 11.

In the following description, it is assumed that the frequency converter according to the present invention is applied to a receiver having a direct conversion type reception architecture. In addition, it is assumed that the frequency of a desired signal (that is the frequency of a desired signal containing desired information of frequencies in the usable bandwidth of the receiver) is the same as the LO frequency and in which the desired signal whose frequency has been converted is a base band signal that is mainly composed of a DC. However, the frequency converter according to the present invention uses an LO signal having an LO frequency that is slightly different from the frequency of the desired signal, the frequency converter can be applied to receivers having various architectures that convert the frequency of a band-limited signal such as a low intermediate frequency type receiver that converts the frequency of a desired signal to a signal having a sufficiently lower intermediate frequency and a double super heterodyne type receiver that performs frequency conversion twice.

Next, the operation of the frequency converter according to this exemplary embodiment will be described with a specific numerical example.

In this example, as a numerical example, it is assumed that the usable bandwidth of the receiver ranges from 40 MHz to 1000 MHz and that the received RF signal that is input to mixer 10 has been band-limited to the usable bandwidth by an upstream band pass filter. In other words, up to 25-th order (=1000/40) harmonics need to be considered as harmonics of an LO signal. Thus, $N_0$ that satisfies $(2N_0-3)=25$ becomes 14. To allow the frequency converter to be easily designed, it is preferable that $N_0$ be an integer. If $N_0$ becomes a terminating decimal or a repeating decimal, $N_0$ needs to be integer N greater than the terminating decimal or repeating decimal. More preferably, if N is the power of 2, the circuit structure becomes simple. Thus, in this numerical example, taking into account more higher order harmonics, it is assumed that $N=16$ $(=2^4)$. At this point, the phase resolution of LO signal generator 11 becomes 11.25 degrees (=180 degrees/16).

Next, the operation of the frequency converter according to this exemplary embodiment for various desired signals having various frequencies will be described.

Figure 5:
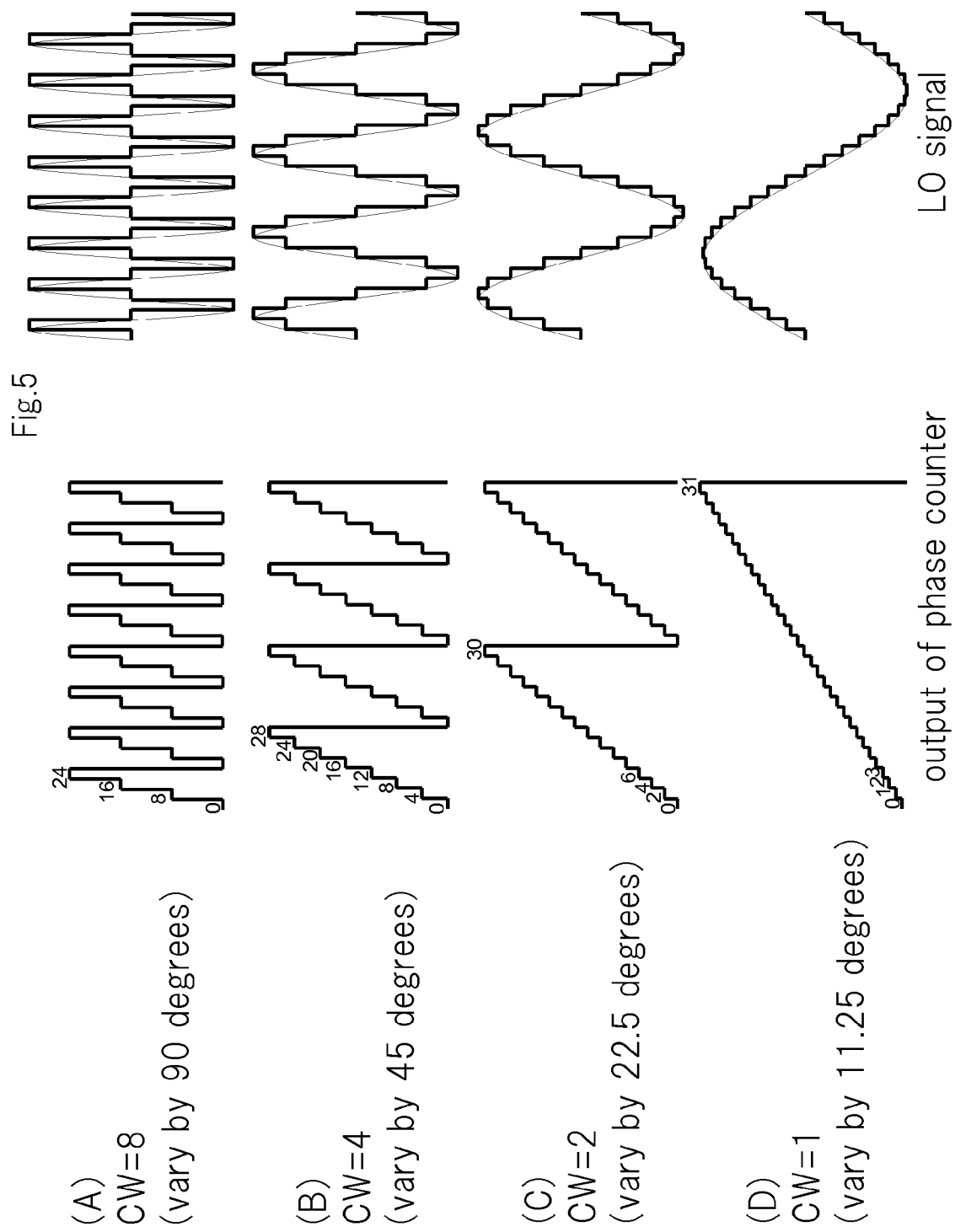
FIG. 5 is a schematic diagram showing a waveform of a signal that is output from the frequency converter according to the first exemplary embodiment of the present invention.

For example, if the frequency of the desired signal is 400 MHz, a frequency three times higher than 400 MHz is 1200 MHz. However, since an interference signal having a frequency of 1200 MHz has been eliminated, even if the LO signal is a square wave and contains many third-order components, the interference signal will not overlap with the desired signal. Thus, $(2N_0-3)=0$, $N_0=1.5$, $N=2$ $(=2^1)$, and phase resolution=90 degrees (=180 degrees/2) are obtained. Consequently, as shown in FIG. 5(A), the waveform of the LO signal has a total of four phases that vary by 90 degrees each.

If the frequency of the desired signal is 200 MHz, interference signals having frequencies of 600 MHz and 1000 MHz that are three times and five times higher than 200 MHz will not be eliminated. Thus, crosstalk with the third-order harmonic and fifth-order harmonic of the LO signal becomes a critical problem. Thus, $(2N_0-3)=5$, $N_0=4$, $N=4$ $(=2^2)$, and phase resolution=45 degrees (=180 degrees/4) are obtained. Consequently, as shown in FIG. 5(B), the waveform of the LO signal has a total of eight phases that vary by 45 degrees each.

If the frequency of the desired signal is 120 MHz, $N=8$ $(=2^3)$ and phase resolution=22.5 degrees (=180 degrees/8) are obtained. Consequently, as shown in FIG. 5(C), the waveform of the LO signal has a total of 16 phases that vary by 22.5 degrees each.

If the frequency of the desired signal is 40 MHz, $N=16$ $(=2^4)$ and phase resolution=11.25 degrees (=180 degrees/16) are obtained. Consequently, as shown in FIG. 5(D), the waveform of the LO signal has a total of 32 phases that vary by 11.25 degrees each.

As described above, in the frequency converter according to this exemplary embodiment, harmonics of the LO signal always lie out of the usable bandwidth of the receiver regardless of the frequency of the desired signal. In other words, harmonics of the LO signal are zero in the usable bandwidth of the receiver.

Thus, since the receiver does not need an RF tracking filter that suppresses interference signals having frequencies of the seventh or higher odd-order harmonics of the LO signal, the size of circuit area and power consumption for the RF tracking filter can be reduced. In addition, the receiver does not need to switch from one band pass filter having a different bandwidths to another band pass filter that corresponds to the frequency of the desired signal. Moreover, if the LO frequency is relatively high and an interference signal having a frequency that is the third-order harmonic of the LO frequency has been eliminated, since a coarse phase resolution of the LO signal can be designated, the LO signal will always be generated with a minimum phase resolution. Thus, since it is not necessary to generate an LO signal having many phases, the power consumption of LO signal generator 11 can be suppressed.

Figure 6:
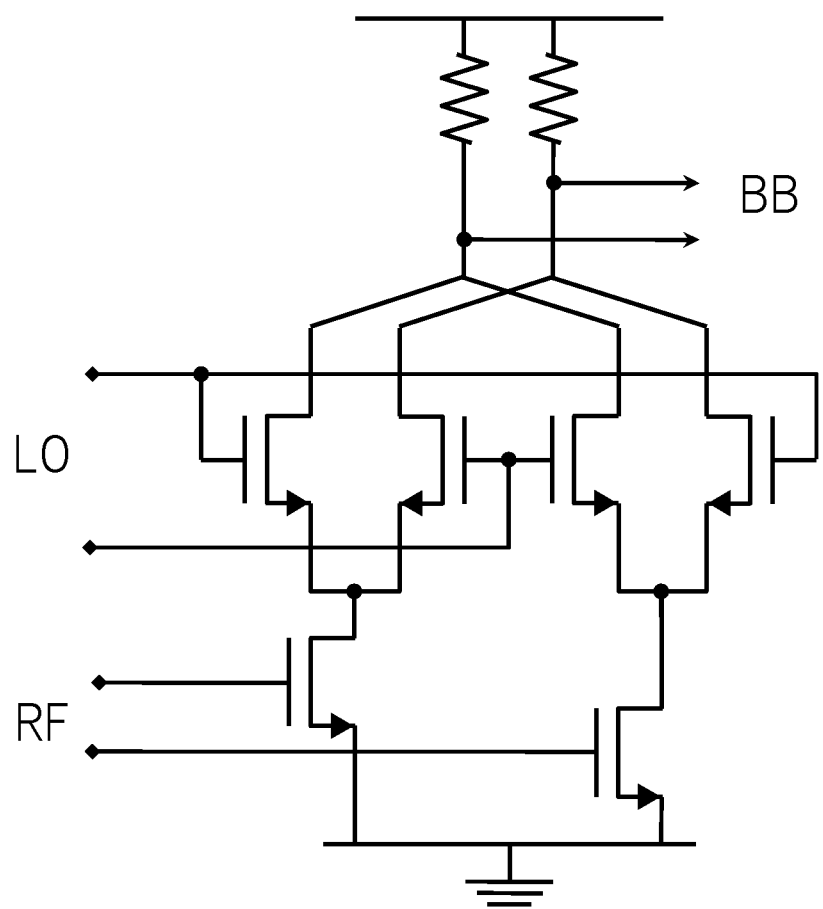
FIG. 6 is a schematic diagram exemplifying a specific structure of a circuit of a mixer according to the first exemplary embodiment of the present invention.

FIG. 6 shows a specific example of a circuit of mixer 10 according to this exemplary embodiment. Mixer 10 is called Gilbert cell mixer 40 and is generally used in an RF circuit. An LO signal that is a cosine wave or a sine wave generated by LO signal generator 11 is input to LO signal input terminals. It is preferable that the amplitude of the LO signal be as large as possible unless the linearity of mixer 10 has deteriorated.

Figure 7A:
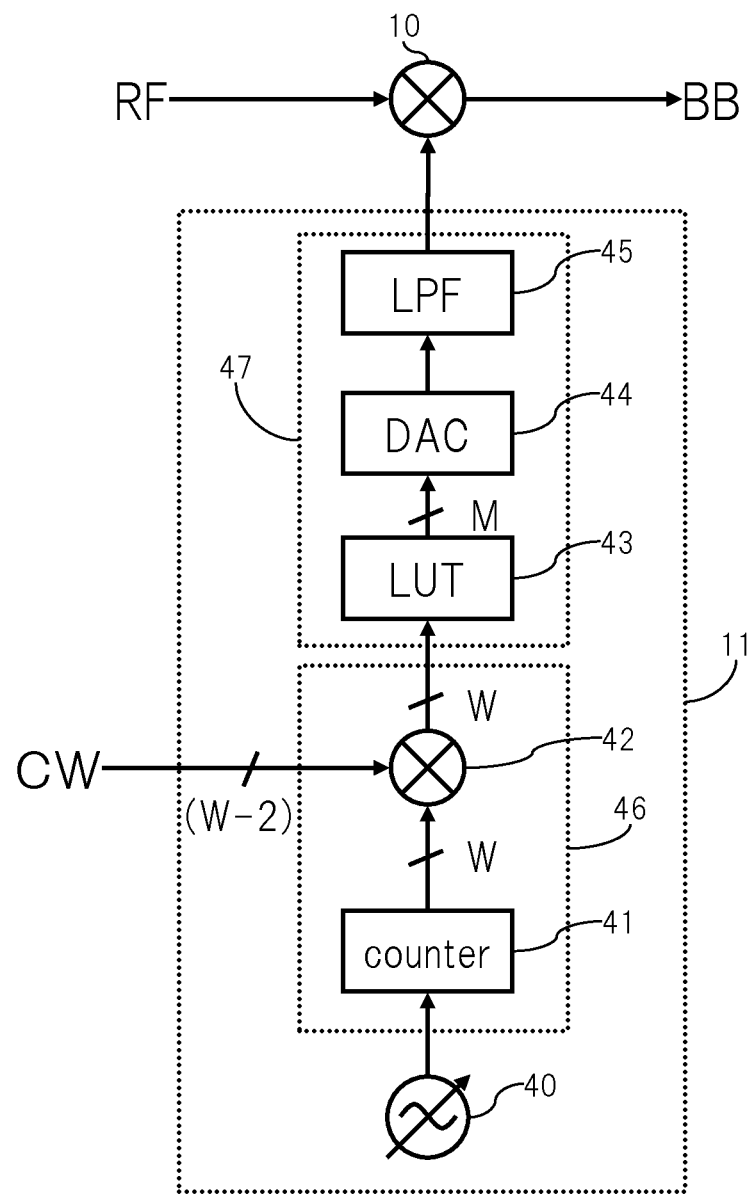
FIG. 7A is a schematic diagram exemplifying a specific structure of an LO signal generator according to the first exemplary embodiment of the present invention.

FIG. 7A shows a specific example of the structural of LO signal generator 11 according to this exemplary embodiment. LO signal generator 11 has variable frequency oscillator 40; phase counter 46 that outputs a phase value corresponding to both an output signal of variable frequency oscillator 40 and control word CW; and phase-to-amplitude value converter 47 that converts the phase value that is output from phase counter 46 into an amplitude value corresponding to the phase value and outputs the converted amplitude value that is an LO signal to mixer 10. Phase counter 46 is composed of counter 41 and multiplying unit 42. Phase-to-amplitude value converter 47 is composed of lookup table (LUT) 43, digital-to-analog converter (DAC) 54, and low pass filter (LPF) 45.

Figure 8:
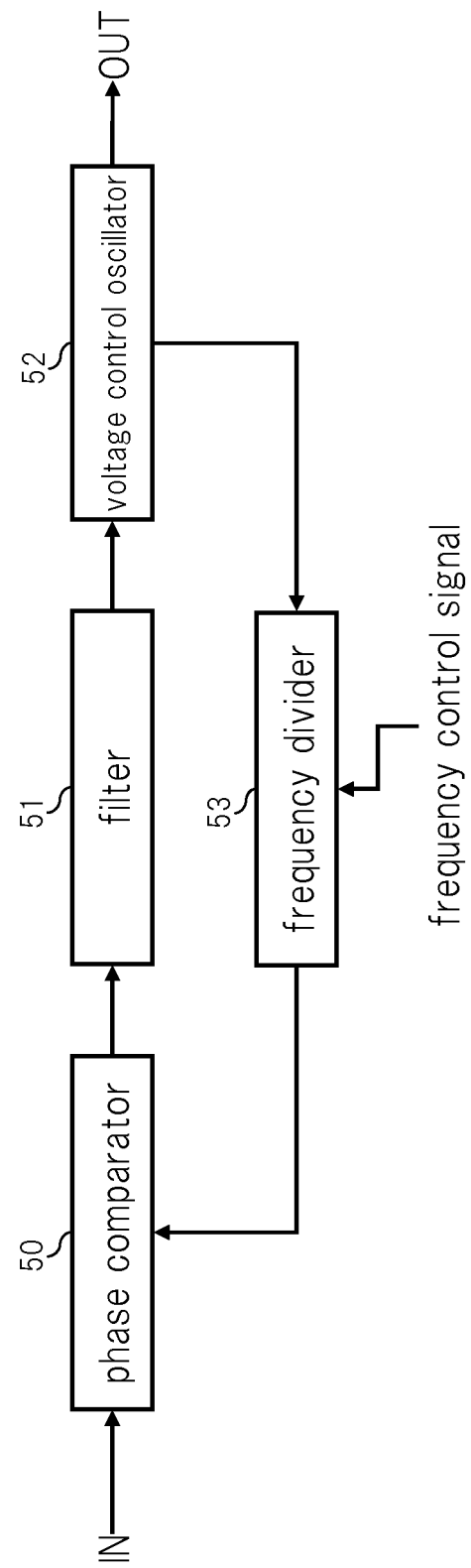
FIG. 8 is a schematic diagram exemplifying a specific structure of a variable frequency oscillator according to the first exemplary embodiment of the present invention.

FIG. 8 shows a specific example of the structure of variable frequency oscillator 40 according to this exemplary embodiment. Variable frequency oscillator 40 is a frequency synthesizer composed of a phase synchronous circuit that is generally used for an RF circuit. Variable frequency oscillator 40 is composed of phase comparator 50, filter 51, voltage control oscillator 52, and frequency divider 53. Variable frequency oscillator 40 varies the oscillation frequency by controlling the frequency division ratio of frequency divider 53. An input signal of variable frequency oscillator 40 is a crystal oscillation wave or the like from which a stable and high accurate signal is obtained. To obtain an LO signal having four phases that vary by 90 degrees each, according to this exemplary embodiment, variable frequency oscillator 40 oscillates at a frequency four times higher than the LO frequency. Thus, with the numerical example of this exemplary embodiment, voltage control oscillator 52 oscillates at the maximum frequency of 4000 MHz (four phases×1000 MHz). To obtain an LO signal having a frequency of 40 MHz and 32 phases that vary by 11.25 degrees each, voltage control oscillator 52 oscillates at the minimum frequency of 1280 MHz (32 phases×40 MHz). When variable frequency oscillator 40 oscillates at a frequency four times higher than the LO frequency so as to obtain an LO signal having four phases, even if the duty ratio of the output signal of variable frequency oscillator 40 deviates from 50%, since counter 41 performs a counting operation only in synchronization with the timing in which the output signal of variable frequency oscillator 40 goes high, as will be described later, as an advantage of this exemplary embodiment, an LO signal having four phases that vary by 90 degrees each can be obtained in high accuracy.

Counter 41 performs a counting operation that counts up one by one in synchronization with the timing in which the output signal of variable frequency oscillator 40 goes high and outputs the counted result to multiplying unit 42. When counter 41 overflows, it counts up from 0 again. The number of bits W of counter 41 depends on up to what order harmonics of the LO signal lie in the usable bandwidth of the receiver if the LO frequency is the lowest with W bits. Up to $(2^W-3)$-th order harmonics can be eliminated. In other words, W is selected such that if the LO frequency is the lowest, the $(2^W-3)$-th order harmonic lies out of the usable bandwidth. Normally, it is sufficient that W is 5 bits or 6 bits. With the numerical example of this exemplary embodiment, it is sufficient that W=5 bits. With W=5 bits, up to 29-th order harmonics can be eliminated. Counter 41 counts up repeatedly from 0 to 31 every period of the output signal of variable frequency oscillator 40 $(=1/f_{Ref}$, where $f_{Ref}$ is the oscillation frequency of variable frequency oscillator 40).

Multiplying unit 42 multiplies the output of counter 41 by control word CW and outputs the multiplied result that is a phase value to LUT 43. Since signals are orthogonally demodulated, the number of bits of CW is represented as (W−2). In other words, even if the third-order harmonic of the LO signal lies out of the usable bandwidth, an LO signal having four phases that vary by 90 degrees each is required. In other words, the output of phase counter 46 needs to have at least four states. The foregoing N corresponds to $(2^{W-1}/CW)$. Taking into account that N is selected such that it becomes a power of 2, CW becomes a power of 2 (1, 2, 4, 8, ...) that is smaller than $2^{W-1}$ and thereby the frequency of variable frequency oscillator 40 becomes a power of 2 of the LO frequency $(2^W/CW)$. If CW is a power of 2, multiplying unit 42 can be implemented as a simple bit shift unit. With the numerical example of this exemplary embodiment, CW is any of 1, 2, 4, and 8 that is a three-bit digital value. CW is selected such that the $(2^W/CW-1)$-th order harmonic of the LO signal lies out of the usable bandwidth corresponding to the frequency of the desired signal. If the LO frequency is 400 MHz, it is sufficient that CW=8. At this point, the output values of multiplying unit 42 become 0, 8, 16, 24, ..., 248. However, taking into account only low order five bits that are input to DAC 44, while counter 41 counts up from 0 to 31, output values of 0, 8, 16, and 24 are repeated eight times. In other words, LO frequency $f_{LO}$ and phase resolution $\Delta\phi$ become $f_{LO}=f_{Ref}\times 8/32=f_{Ref}/4$ and $\Delta\phi=360°\times 8/32=90$ degrees, respectively, where $f_{Ref}$ is the frequency of variable frequency oscillator 40. When the LO frequency is 200 MHz, it is sufficient that CW=4. At this point, the output values of multiplying unit 42 become 0, 4, 8, 16, . . . , 124. Taking into account only the low order five bits, output values of 0, 4, 8, 12, . . . , 28 are repeated four times. In other words, the LO frequency $f_{LO}$ and the phase resolution $\Delta\phi$ become $f_{LO}=f_{Ref}/8$ and $\Delta\phi=45$ degrees, respectively. When the LO frequency is 120 MHz, with CW=2, $f_{LO}=f_{Ref}/16$ and $\Delta\phi=22.5$ are obtained. When the LO frequency is 40 MHz, with CW=1, $f_{LO}=f_{Ref}/32$ and $\Delta\phi=11.25$ are obtained. When these results are generalized, frequency $f_{LO}$ of the LO signal and phase resolution $\Delta\phi$ can be given by the following formula (1).

$$f_{LO}=f_{Ref}\times CW1/2^W$$

$$\Delta\Phi=360°/(f_{Ref}/f_{LO})=360°\times CW1/2^W \quad \text{[Formula 1]}$$

In other words, when CW is doubled, the LO frequency is also doubled, but the phase resolution is halved thereby becomes coarse. The outputs of phase counter 46 corresponding to CW=8, 4, 2, and 1 are shown in FIGS. 5(A), (B), (C), and (D), respectively.

According to this exemplary embodiment, the number of bits of counter 41 is fixed and phase counter 46 causes multiplying unit 42 to perform a bit shift operation corresponding to control word CW. Even if phase counter 46 causes the number of bits of counter 41 to vary with CW, the same effect can be obtained (in this case, multiplying unit 42 can be omitted). For example, with CW=8, phase counter 46 operates as a two-bit counter; with CW=4, phase counter 46 operates as a three-bit counter; with CW=2, phase counter 46 operates as a four-bit counter; and with CW=1, phase counter 46 operates as a five-bit counter.

Figure 7B:
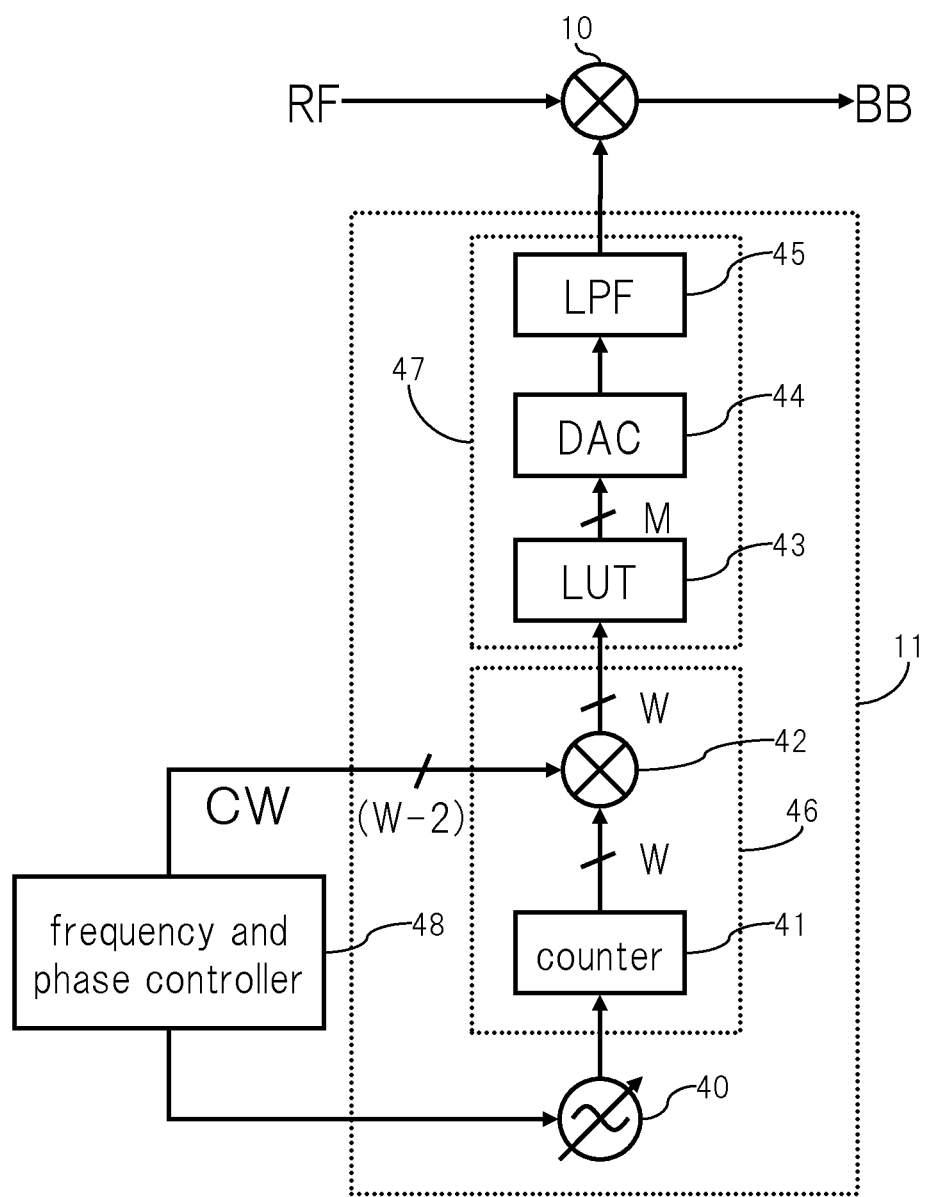
FIG. 7B is a schematic diagram exemplifying a specific structure of the frequency converter according to the first exemplary embodiment of the present invention.

As described above, the frequency of variable frequency oscillator 40 and the phase resolution of phase counter 46 are decided depending on the LO frequency. Thus, as shown in FIG. 7B, the frequency converter according to this exemplary embodiment may be structured to have frequency and phase controller 48 that outputs control word CW to phase counter 46 and that outputs a frequency control signal to variable frequency oscillator 40.

LUT 43 converts the phase value that is output from phase counter 46 into a digital amplitude value (cosine value or sine value) corresponding to the phase value and then outputs the amplitude value to DAC 44. With the numerical example of this exemplary embodiment, when W=5 bits and CW=$2^3$=8, phase counter 46 outputs phase values 0, 8, 16, and 24 that correspond to phases 0, 90, 180, and 270 degrees, respectively. Thus, LUT 43 outputs cosine values cos (0°)=1, cos (90°)=0, cos (180°)=−1, and cos (270°)=0 that are digital values. Of course, to obtain its orthogonal signal, LUT 43 outputs a sine value corresponding to the phase value. The number of bits M of LUT 43 depends on how many harmonics of the LO signal need to be suppressed. To suppress harmonics to 0.1% or less of the desired signal, the number of bits M needs to be 10 bits.

DAC 44 converts a digital amplitude value that is output from LUT 43 into an analog value and then outputs the analog value to LPF 45. The signal that is output from DAC 44 is a step-shaped analog signal. FIG. 9 shows a specific example of circuits of DAC 44 and LPF 45. DAC 44 converts input binary code into thermometer code and connects current sources to a plus output terminal or a minus output terminal depending on the thermometer code. An output signal of DAC 44 is obtained in such a manner that the current signal is converted into a voltage. The number of bits of DAC 44 is the same as that of LUT 43. According to this exemplary embodiment, the LO signal is transferred as a binary square digital signal regardless of the LO frequency until DAC 44 coverts the LO signal into an analog signal. Such a digital signal can be transferred using a recent miniaturized CMOS structure that allows the size of circuit area and power consumption to be reduced. Alternatively, a DAC that uses current sources and resistors that are weighted with binary values and a so-called R-2R ladder type DAC in which a resistor having resistance R and a resistor having resistance 2R are connected in a ladder shape can be applied as DAC 44 without deteriorating the effect of this exemplary embodiment.

LPF 45 is a circuit that suppresses harmonics that occur in a step-shaped analog signal that is output from DAC 44. In FIG. 9, capacitors connected to the output terminal serve as LPF 45. The time constant of LPF 45 is represented by the product of the resistance and the capacitance of resistors and capacitors connected to the output terminal. However, since the frequencies of harmonics contained in the output signal of DAC 44 lie out of the usable bandwidth of the receiver and since interference signals that have these frequencies have already been eliminated, LPF 45 may be omitted without an adverse outcome. The capacitors used in LPF 45 occupy a large area of the chip. If LPF 45 is omitted, the size of circuit area and cost can be advantageously reduced. In contrast, even if harmonics of the LO signal occur in the usable bandwidth of the receiver, when LPF 45 that has a sufficient attenuation characteristic is used, it can suppress the harmonics. In this case, since a coarser phase resolution can be designated, the oscillation frequency of variable frequency oscillator 40 can be decreased, the number of bits of phase counter 46 can be decreased, and the numbers of bits of LUT 43 and DAC 44 can be decreased. As a result, since the number of digital circuits that operate at high speed is decreased, the power consumption can be advantageously reduced.

(2) Second Exemplary Embodiment

Figure 10A:
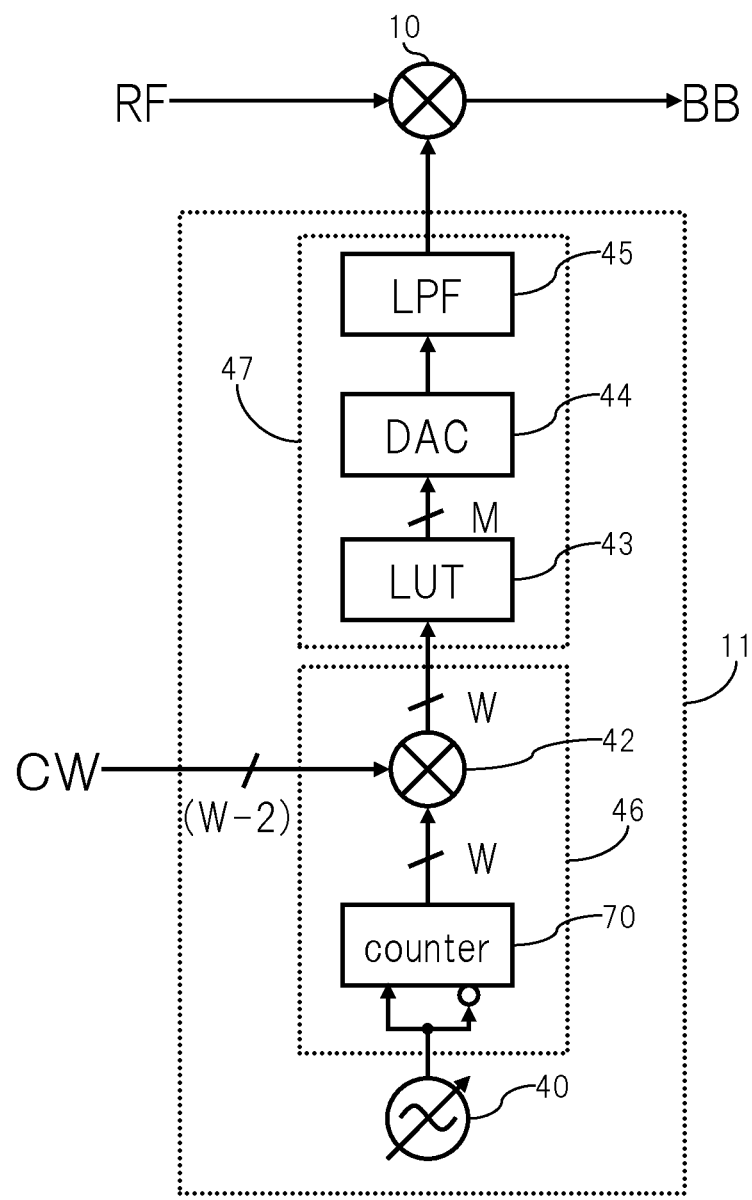
FIG. 10A is a schematic diagram showing the structure of a frequency converter according to a second exemplary embodiment of the present invention.

FIG. 10A shows the structure of a frequency converter according to a second exemplary embodiment of the present invention. The frequency converter according to this exemplary embodiment is different from the frequency converter according to the first exemplary embodiment in that phase counter 46 causes counter 70 to perform a counting operation in synchronization with both the timings in which the output signal of variable frequency oscillator 40 goes high and low. Thus, since counter 70 operates at a frequency two times higher than the frequency of variable frequency oscillator 40, the frequency range of variable frequency oscillator 40 is half that of the first exemplary embodiment. With the numerical example of the first exemplary embodiment, variable frequency oscillator 40 has a frequency range from 640 MHz to 2000 MHz. As a result, the current consumption of variable frequency oscillator 40 and the drive circuit of counter 70 can be suppressed.

Figure 10B:
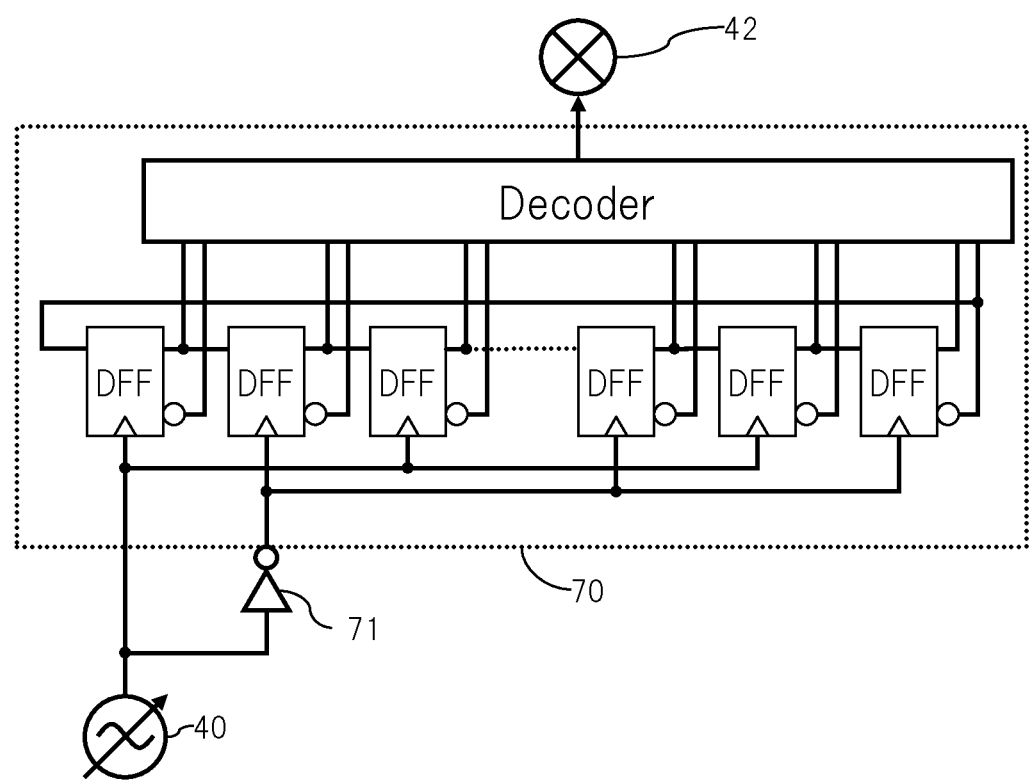
FIG. 10B is a schematic diagram exemplifying a specific structure of a circuit of a counter according to the second exemplary embodiment of the present invention.

FIG. 10B shows a specific example of a circuit of counter 70 according to this exemplary embodiment. Counter 70 has a shift counter composed of delay type flip-flops (DFFs) that are connected in tandem; and a decoder that converts an output signal of the shift counter into a binary digital signal. Since clock signals having phases of 0 degree and 180 degrees are alternately input to clock input terminals of the DFFs that are connected in tandem, counter 70 effectively operates at a frequency that is two times higher than the frequency of the input clock signals. This shift counter outputs multi-phase clock signals having a duty ratio of 50% in which they delay by half period relative to the input clock signals. The decoder converts these multi-phase clock signals into binary digital signals corresponding to phase states of the multi-phase clock signals. For example, if 16 DFFs are connected in tandem, a clock signal having 32 phases can be obtained. When the clock signal is decoded, a five-bit binary signal can be obtained. Although inverter 71 is shown in the drawing, if variable frequency oscillator 40 outputs differential signals, inverter 71 can be omitted.

(3) Third Exemplary Embodiment

Figure 11A:
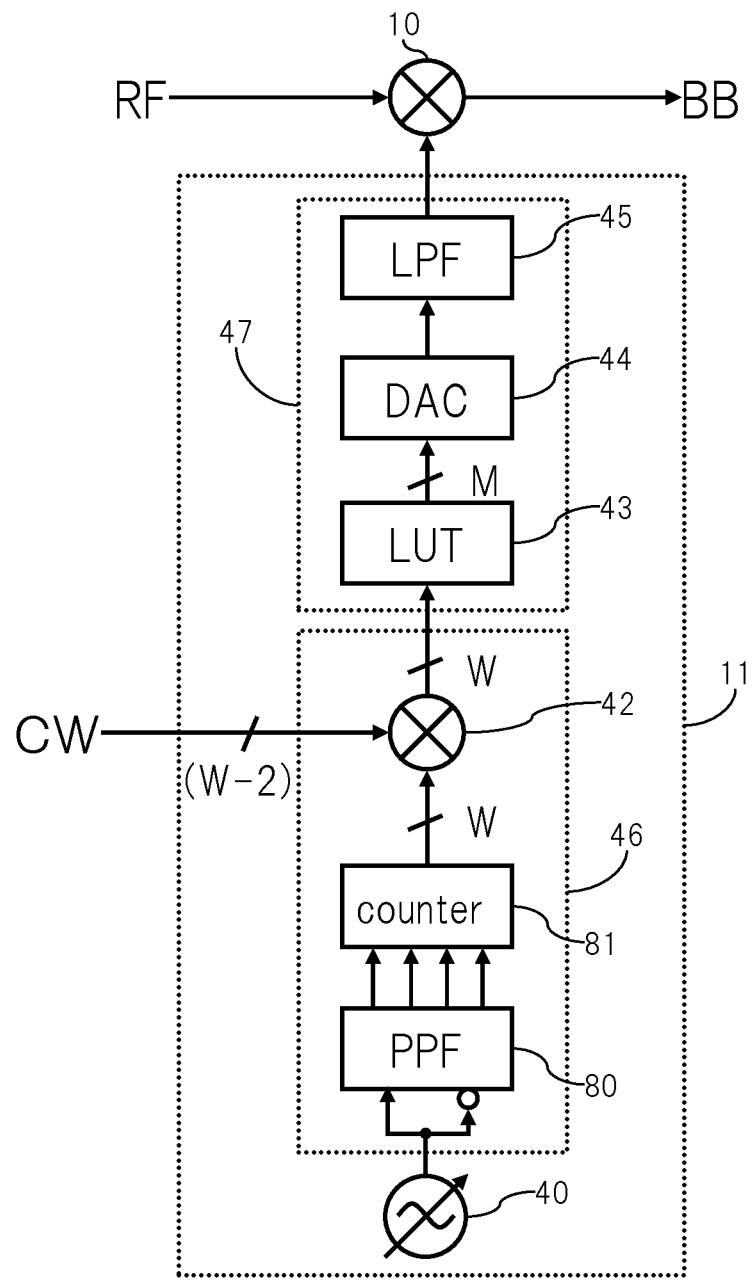
FIG. 11A is a schematic diagram showing the structure of a frequency converter according to a third exemplary embodiment of the present invention.

FIG. 11A shows the structure of a frequency converter according to a third exemplary embodiment of the present invention. The frequency converter according to this exemplary embodiment is different from the frequency converters according to the first and second exemplary embodiments in that phase counter 46 causes poly-phase filter (PPF) 80 to convert an output signal of variable frequency oscillator 40 into a signal having four phases that vary by 90 degrees each and drives counter 81 with the four-phase signal. Thus, since counter 81 operates at a frequency four times higher than the frequency of variable frequency oscillator 40, the frequency range of variable frequency oscillator 40 becomes half of the second exemplary embodiment. Thus, with the numerical example of the first exemplary embodiment, variable frequency oscillator 40 has a frequency range from 320 MHz to 1000 GHz. As a result, the current consumption of variable frequency oscillator 40 and the drive circuit of counter 81 can be suppressed. However, to cause PPF 80 to output a clock signal having a total of four phases that vary accurately by 90 degrees each, it is necessary to vary the time constant of PPF 80 corresponding to the LO frequency.

Figure 11B:
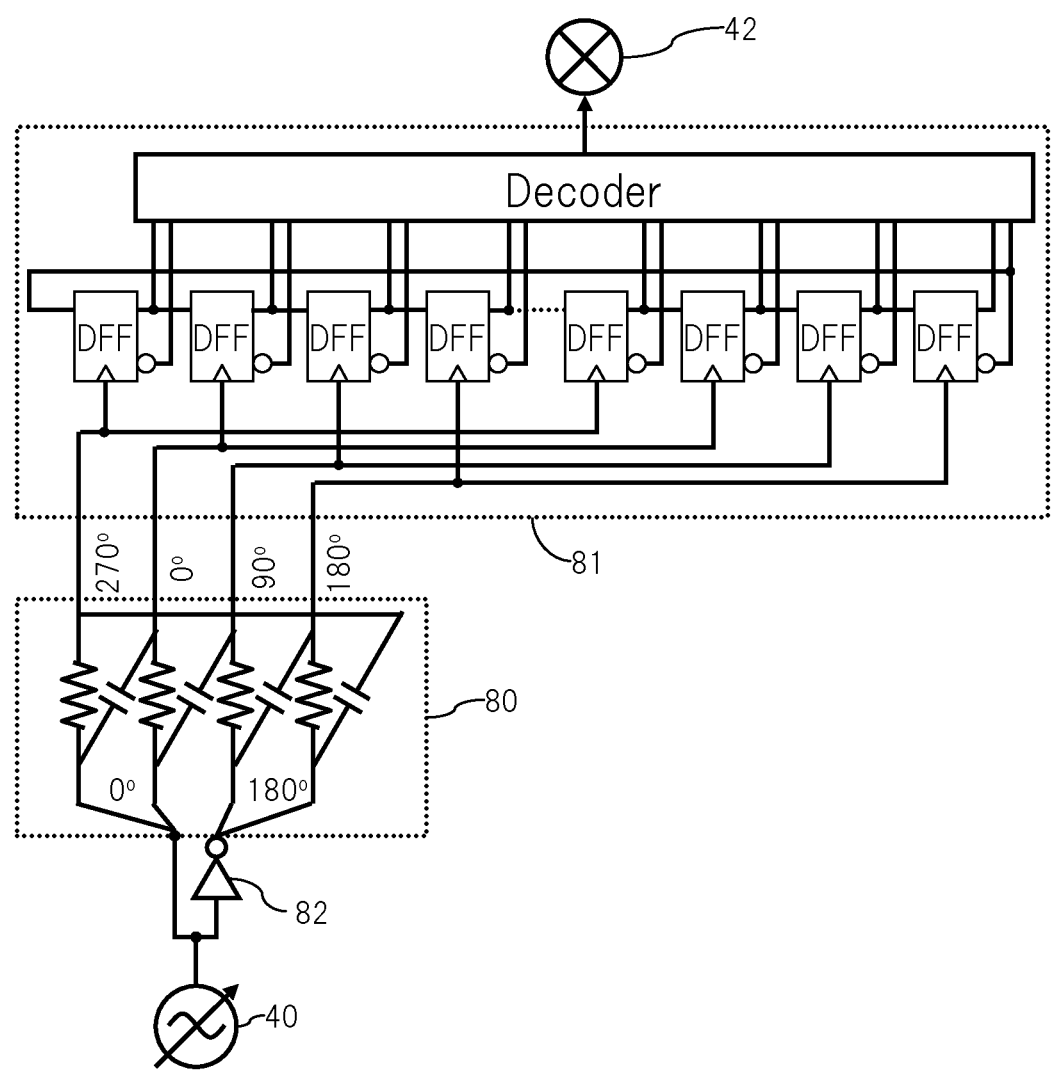
FIG. 11B is a schematic diagram exemplifying specific structures of circuits of a PPF and a counter according to the third exemplary embodiment of the present invention.

FIG. 11B shows a specific example of circuits of PPF 80 and counter 81 according to this exemplary embodiment. Like the structure shown in FIG. 10B, counter 81 has a shift counter composed of DFFs that are connected in tandem; and a decoder that converts an output signal of the shift counter into a binary digital signal. This shift counter is different from the shift counter shown in FIG. 10B in that PPF 80 cyclically inputs clock signals having phases of 0, 90, 180, and 270 degrees to clock signal input terminals of the individual DFFs that are connected in tandem and thereby the shift counter shown in FIG. 11B effectively operates at a frequency four times higher than the frequency of the input clock signals. This shift counter outputs a multi-phase clock signal that is shifted by a ¼ period of the input clock signal and that has a duty ratio of 50%. The decoder converts the multi-phase clock signals into binary digital signals corresponding to the phases of the multi-phase clock signals. The number of DFFs required for counter 81 according to this exemplary embodiment is the same as that of the second exemplary embodiment. Although inverter 82 is shown in the drawing, if variable frequency oscillator 40 outputs differential signals, inverter 82 can be omitted.

(4) Fourth Exemplary Embodiment

Figure 12:
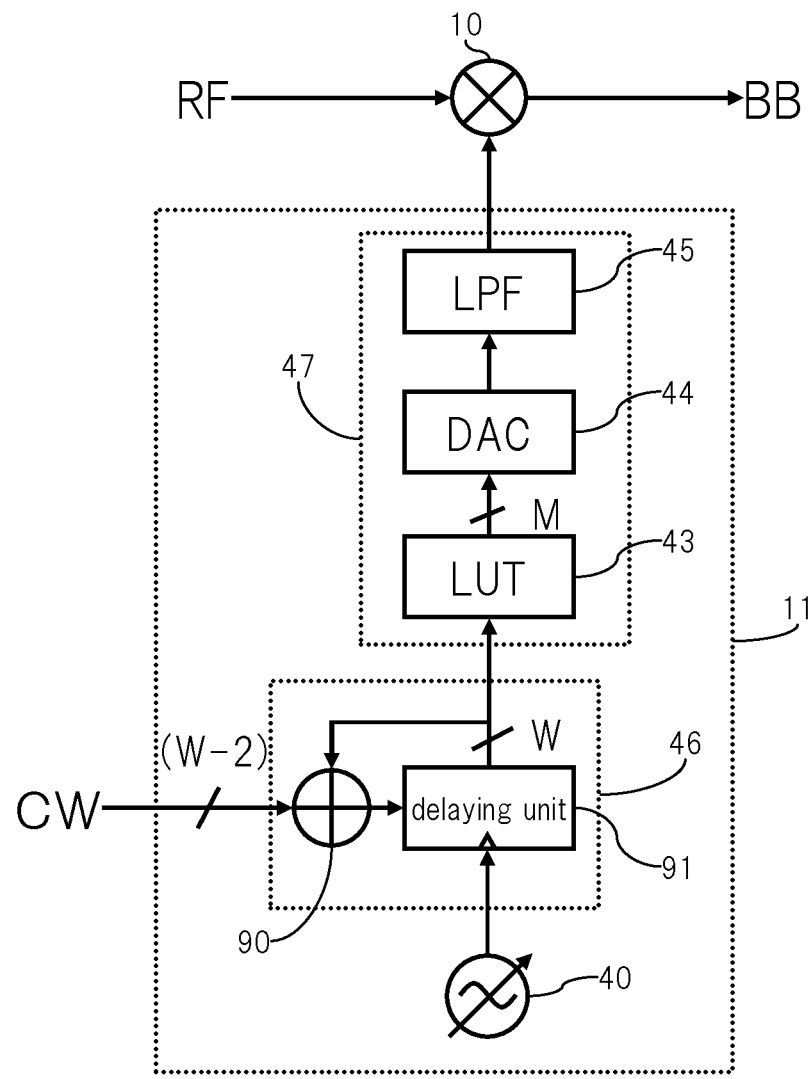
FIG. 12 is a schematic diagram showing the structure of a frequency converter according to a fourth exemplary embodiment of the present invention.

FIG. 12 shows the structure of a frequency converter according to a fourth exemplary embodiment of the present invention. The frequency converter according to this exemplary embodiment is different from the frequency converters according to the first to third exemplary embodiments in that instead of a counter and a multiplying unit, phase counter 46 has adding unit 90 that adds an amplitude value that is output from phase counter 46 and control word CW; and delaying unit 91 that delays the added result that is output from adding unit 90 by a period of an output signal of variable frequency oscillator 40 and then outputs the resultant signal that is a phase value to LUT 43. LO signal generator 11 according to this exemplary embodiment has a structure of a direct digital synthesizer (DDS) that is generally used. The number of bits W of each of adding unit 90 and delaying unit 91 is the same as the number of bits of each of the counters according to the first to third exemplary embodiments. It is sufficient that the number of bits W of each of adding unit 90 and delaying unit 91 is 5 bits or 6 bits unlike an ordinary DDS that uses a phase counter having 28 bits or 32 bits that results in large power consumption. In the structure using an adding unit and a delaying unit according to this exemplary embodiment, when delaying unit 91 is driven with differential signals or four phases in the same manner as the second or third exemplary embodiment, the oscillation frequency of variable frequency oscillator 40 can be halved or quartered compared with that of the first exemplary embodiment.

(5) Fifth Exemplary Embodiment

Figure 13:
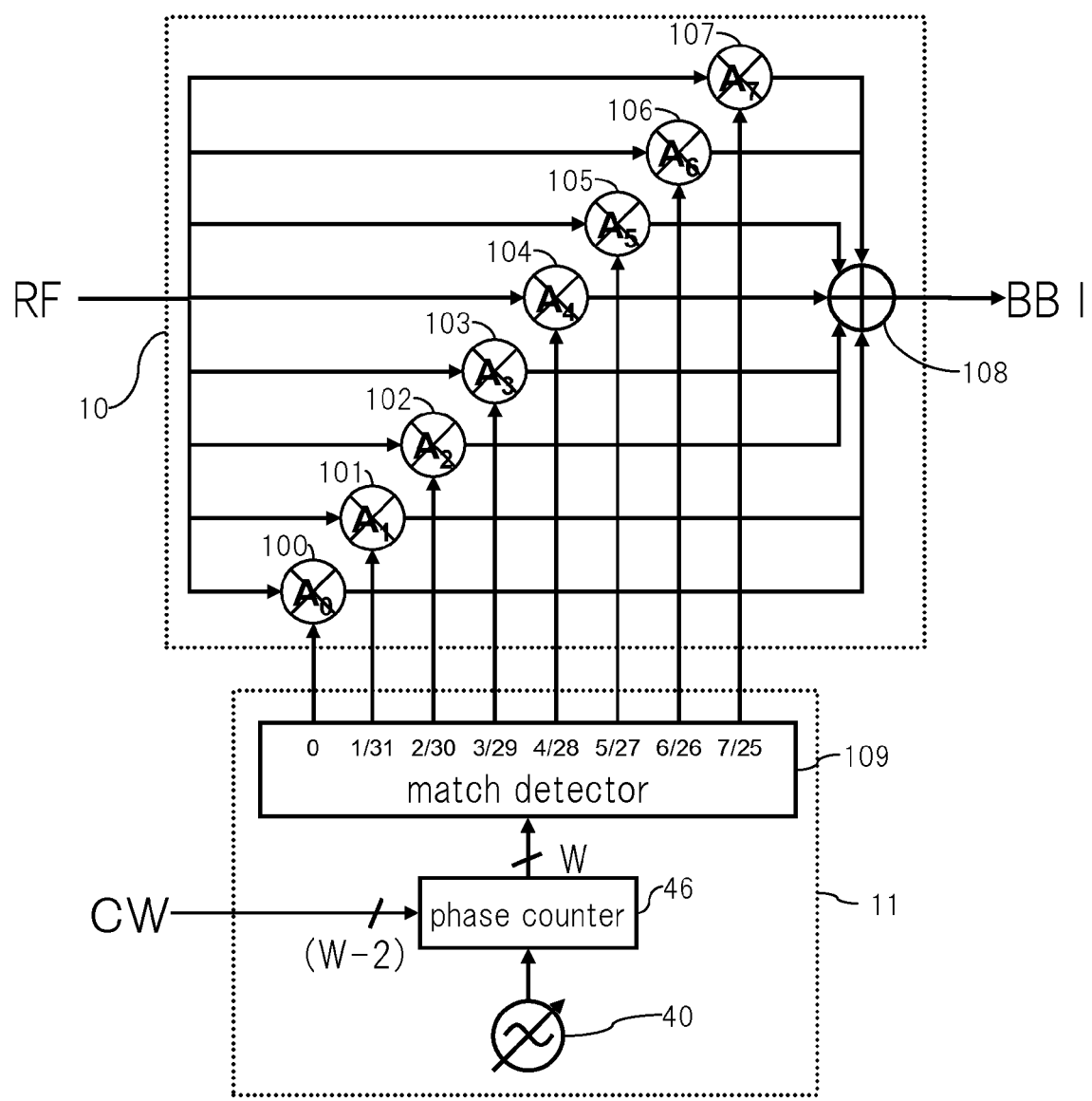
FIG. 13 is a schematic diagram showing the structure of a frequency converter according to a fifth exemplary embodiment of the present invention.

FIG. 13 shows the structure of a frequency converter according to a fifth exemplary embodiment of the present invention. The frequency converter according to this exemplary embodiment is different from the frequency converters according to the first to fourth exemplary embodiments in that mixer 10 is composed of a plurality of discrete mixers 100~107 and adding unit 108 and in that LO signal generator 11 is composed of match detector 109 instead of phase-amplitude value converter 47. Match detector 109 is a logic circuit that outputs a plurality of discrete LO signals that are binary square waves.

Since the LO signals have a square waveform with a sufficient amplitude, discrete mixers 100~107 could be switching mixers that have excellent linearity, easily obtain signal gains, and accomplish low noise index. In addition, since the frequency converter according to this exemplary embodiment has an additional route that transfers LO signals that are binary square waves compared to the first to fourth exemplary embodiments that use the DAC, the frequency converter according to this exemplary embodiment has advantages in which the size of circuit area and power consumption are more reduced than in the first to fourth exemplary embodiments.

Match detector 109 is composed of a plurality of discrete match detectors (not shown). The discrete match detectors each detect whether or not a phase value that is output from phase counter 46 matches a phase value that has been designated. If so, they output a binary discrete LO signal to mixer 10. These discrete match detectors can be composed of a simple digital circuit.

Discrete mixers 100~107 are provided corresponding to a plurality of discrete match detectors. Discrete mixers 100~107 each multiply a discrete LO signal that is output from a corresponding discrete match detector by the received RF signal and weight the multiplied result with a predetermined conversion gain. The predetermined conversion gain designed for each of discrete mixers 100~107 is a value proportional to a cosine value or a sine value corresponding to a discrete LO signal that is output from the corresponding discrete match detector.

Adding unit 108 adds the weighted multiplied results that are output from discrete mixers 100~107 and outputs the added result.

Next, the operation of the frequency converter according to this exemplary embodiment will be described with the numerical example of the first exemplary embodiment. In other words, it is assumed that the usable bandwidth of the receiver ranges from 40 MHz to 1000 MHz, W is 5 bits, and CW is a 3-bit digital value.

Discrete mixers 100~107 need to have eight types of conversion gains proportional to $A_0=\cos(0°)$, $A_1=\cos(11.25°)$, $A_2=\cos(22.5°)$, $A_3=\cos(33.75°)$, $A_4=\cos(45°)$, $A_5=\cos(56.25°)$, $A_6=\cos(67.5°)$, and $A_7=\cos(78.75°)$, respectively. Generally, the frequency converter according to this exemplary embodiment needs $2^{W-2}$ discrete mixers. The conversion gains of these discrete mixers can be generally represented by $A_k=\cos(360°\times k/2^{W-2})$ where k is an integer ranging from 0 to $(2^{W-2}-1)$.

Match detector 109 supplies a binary square wave that is a discrete LO signal to discrete mixer 100 such that only when the output of phase counter 46 is 0 (corresponding to phase 0°), the square wave becomes the high level and otherwise it becomes the low level. Likewise, match detector 109 supplies the square wave to discrete mixer 101 such that only when the output of phase counter 46 is 1 or 31 (corresponding to phase ±11.25°), the square wave becomes the high level. Match detector 109 supplies the square wave to discrete mixer 102 such that only when the output of phase counter 46 is 2 or 30 (corresponding to phase ±11.25°), the square wave becomes the high level. Match detector 109 supplies the square wave to discrete mixer 103 such that only when the output of phase counter 46 is 3 or 29 (corresponding to phase ±11.25°), the square wave becomes the high level. Match detector 109 supplies the square wave to discrete mixer 104 such that only when the output of phase counter 46 is 4 or 28 (corresponding to phase ±11.25°), the square wave becomes the high level. Match detector 109 supplies the square wave to discrete mixer 105 such that only when the output of phase counter 46 is 5 or 27 (corresponding to phase ±11.25°), the square wave becomes the high level. Match detector 109 supplies the square wave to discrete mixer 106 such that only when the output of phase counter 46 is 6 or 26 (corresponding to phase ±11.25°), the square wave becomes the high level. Match detector 109 supplies the square wave to discrete mixer 107 such that only when the output of phase counter 46 is 7 or 25 (corresponding to phase ±11.25°), the square wave becomes the high level. Since adding unit 108 adds outputs of discrete mixers 100~107, although square discrete LO signals are used, the frequency conversion for an LO signal that is a pseudo-cosine wave can accomplished. In other words, crosstalk with interference signals of harmonics of the LO signal can be suppressed. In this case, the frequency converter operates so as to obtain base band I signal. If the phase of the LO signal is varied by 90 degrees, the frequency converter operates so as to obtain base band Q signal. If the phase of the LO signal is varied by 180 degrees, the frequency converter operates so as to obtain an inverted signal of base band I signal. If the phase of the LO single is varied by 270 degrees, the frequency converter operates so as to obtain an inverted signal of base band Q single.

Next, the operation of the frequency converter according to this exemplary embodiment will be described with desired signals having various frequencies.

First, it is assumed that the desired signal has a frequency of 400 MHz. In this case, an interference signal having a frequency that is three times higher than the frequency of the desired signal has been eliminated by an upstream band pass filter. At this point, since CW=8 and phase counter 46 outputs 0, 8, 16, and 24, only discrete mixer 100 operates. When phase counter 46 outputs 16, since an inverted signal of base band I signal is obtained, the waveform of the LO signal pseudo-represented by the operation of the frequency converter according to this exemplary embodiment matches the waveform shown in FIG. 5(A).

Next, it is assumed that the frequency of the desired signal is 200 MHz. In this case, interference signals having frequencies that are up to five times higher than the frequency of the desired signal are input to mixer 10. At this point, since CW=4 and phase counter 46 outputs 0, 4, 8, . . . , 28, discrete mixers 100 and 104 operate. When the phase of the LO signal is shifted by 180 degrees, since an inverted signal of base band I signal is obtained, the waveform of the LO signal pseudo-represented matches the waveform shown in FIG. 5(B).

Likewise, when the frequency of the desired signal is 120 MHz, since CW=2 and discrete mixers 100, 102, 104, and 106 operate, the waveform of the LO signal pseudo-represented matches the waveform shown in FIG. 5(C). When the frequency of the desired signal is 400 MHz, since CW=1 and all discrete mixers 100~107 operate, the waveform of the LO signal pseudo-represented matches the waveform shown in FIG. 5(D).

Figure 14A:
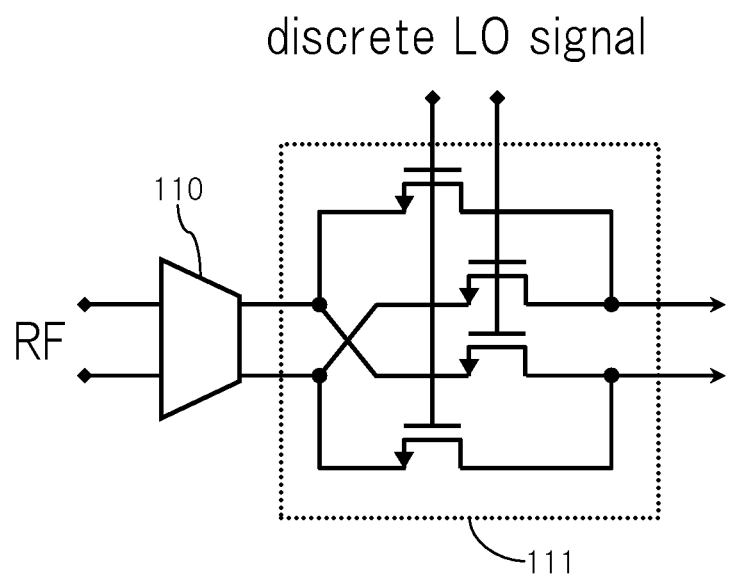
FIG. 14A is a schematic diagram exemplifying a specific structure of a circuit of discrete mixers according to the fifth exemplary embodiment of the present invention.
Figure 14B:
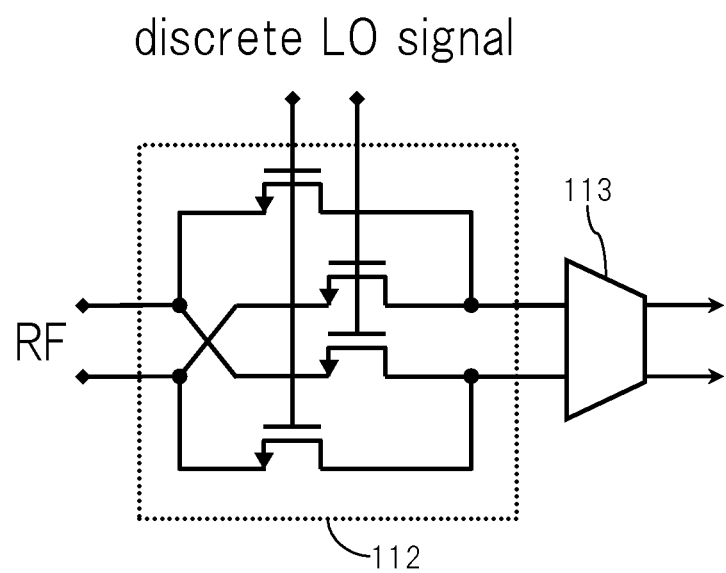
FIG. 14B is a schematic diagram exemplifying a specific structure of a circuit of discrete mixers according to the fifth exemplary embodiment of the present invention.

FIG. 14A and FIG. 14B show specific examples of circuits of discrete mixers 100~107 according to this exemplary embodiment. FIG. 14A shows an example of a discrete mixer composed of voltage-to-current converter 110 and switching pair 111. In this example, voltage-to-current converter 110 converts an RF received signal (RF voltage signal) into a current signal, whereas switching pair 111 converts an RF current signal into a base band signal (current signal) and outputs the converted signal. The frequency conversion gain can vary corresponding to the voltage-to-current conversion gain of voltage-to-current converter 110. FIG. 14B shows an example of a discrete mixer composed of switching pair 112 and voltage-to-current converter 113. In this example, switching pair 112 converts an RF received signal (RF voltage signal) into a base band signal (voltage signal), whereas voltage-to-current converter 113 converts a base band signal (voltage signal) into a current signal. The frequency conversion gain can vary corresponding to the voltage-to-current conversion gain of voltage-to-current converter 113. In other words, since FIG. 14A shows a discrete mixer that converts an RF signal (current signal) into a voltage signal, whereas FIG. 14B shows a discrete mixer that converts a base band signal (voltage signal) into a current signal.

Figure 14C:
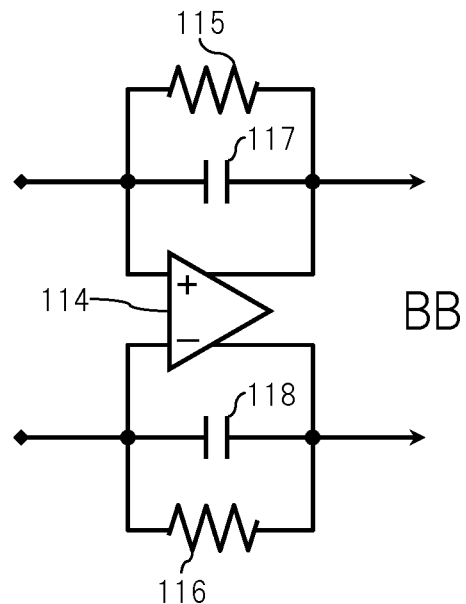
FIG. 14C is a schematic diagram exemplifying a specific structure of a circuit of an adding unit according to the fifth exemplary embodiment of the present invention.

FIG. 14C shows a specific example of a circuit of adding unit 108 according to this exemplary embodiment. Adding unit 108 is a transimpedance amplifier composed of operational amplifier 114, resistors 115 and 116, and capacitors 117 and 118. Currents $(I_0, I_1, \ldots, I_7)$ flow from discrete mixers 100~107 to a plus input terminal of operational amplifier 114. The currents flow to resistor 115 (resistance R). As a result, the upper output terminal of operational amplifier 114 outputs a voltage proportional to the currents that flow to resistor 115 $(R\times(I_0+I_1+\ldots+I_7))$. In contrast, reverse currents flow to a minus input terminal of operational amplifier 114. As a result, the lower output terminal of operational amplifier 114 outputs a reverse voltage $(-R\times(I_0+I_1+\ldots+I_7))$. Capacitors 117 and 118 are used to eliminate unnecessary interference signals.

Figure 15A:
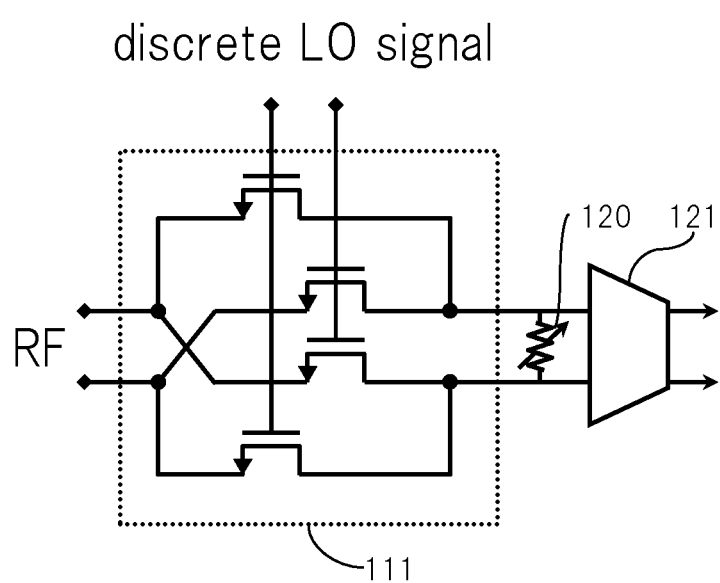
FIG. 15A is a schematic diagram further exemplifying a specific structure of a circuit of discrete mixers according to the fifth exemplary embodiment of the present invention.
Figure 15B:
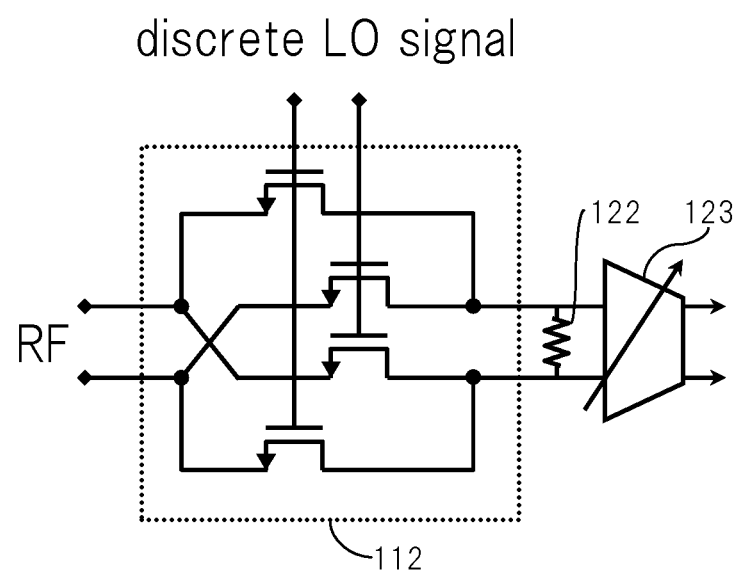
FIG. 15B is a schematic diagram further exemplifying a specific structure of a circuit of discrete mixers according to the fifth exemplary embodiment of the present invention.

If the received RF signal that is input to the frequency converter according to this exemplary embodiment is an RF current signal, discrete mixers 100~107 may be structured as shown in FIG. 15A or FIG. 15B. In this case, each of discrete mixers 100~107 is composed of switching pair 111 or 112; discrete load resistor 120 or 122 that converts a current signal into a voltage signal; and discrete voltage-to-current converter 121 or 123 that converts a voltage signal into a current signal again. In FIG. 15A, the conversion gain varying function of discrete mixers 100~107 corresponding to tap coefficients of the FIR (Finite Impulse Response) filter is accomplished by load resistor 120; in FIG. 15B, the conversion gain varying function of discrete mixers 100~107 corresponding thereto is accomplished by discrete voltage-to-current converter 123. Discrete load resistors 120 and 122 can be structured as a transimpedance amplifier that uses the operational amplifier shown in FIG. 14C. In contrast, adding unit 108 (FIG. 13) that adds outputs of discrete mixers 100~107 can be structured as an ordinary load resistor.

(6) Sixth Exemplary Embodiment

Figure 16:
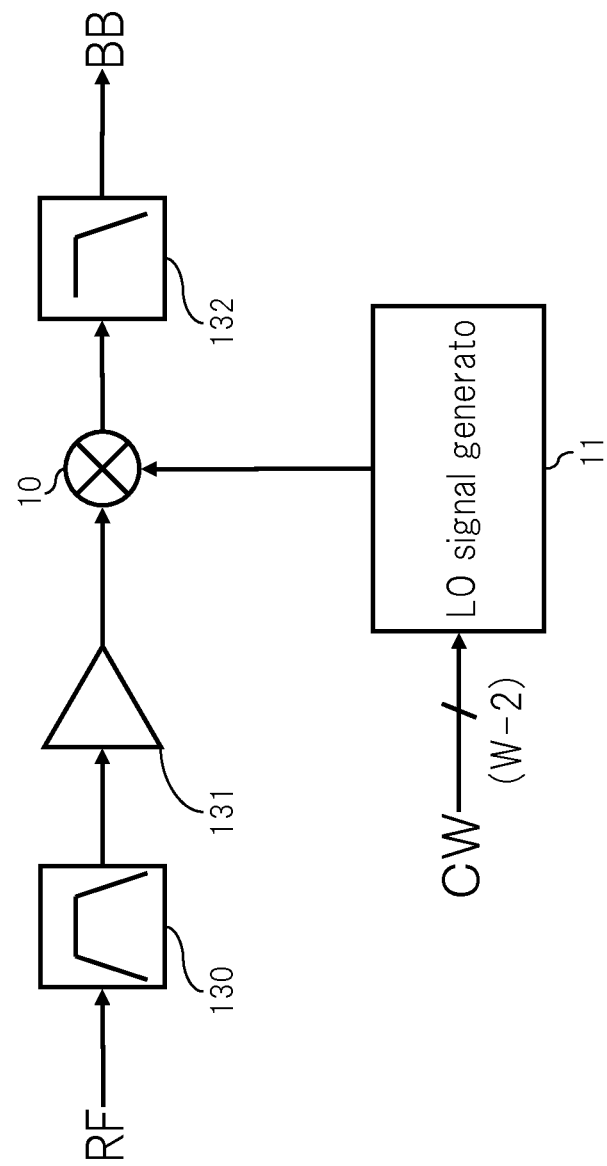
FIG. 16 is a schematic diagram showing the structure of a receiver according to a sixth exemplary embodiment of the present invention.

FIG. 16 shows the structure of a receiver according to a sixth exemplary embodiment of the present invention. The receiver according to this exemplary embodiment is composed of mixer 10; LO signal generator 11; band pass filter 130 that limits the bandwidth of the received RF signal in the usable bandwidth of the receiver; LNA 131; and channel pass filter 132 that eliminates interference signals having frequencies in the neighborhood of the frequency of a desired signal from the output signal of mixer 10, Mixer 10 and LO signal generator 11 are those according to any one of the first to fifth exemplary embodiments.

The receiver according to this exemplary embodiment can prevent crosstalk with interference signals of harmonics of the LO signal using only one band selection filter 250 without it being necessary to use an RF tracking filter. Depending on the signal-to-noise ratio necessary for communication, the receiver according to this exemplary embodiment can omit LNA 131. According to this exemplary embodiment, an analog-to-digital converter may be located downstream of mixer 10 so as to accomplish the function of channel pass filter 132 with a digital circuit.

(7) Seventh Exemplary Embodiment

Figure 17:
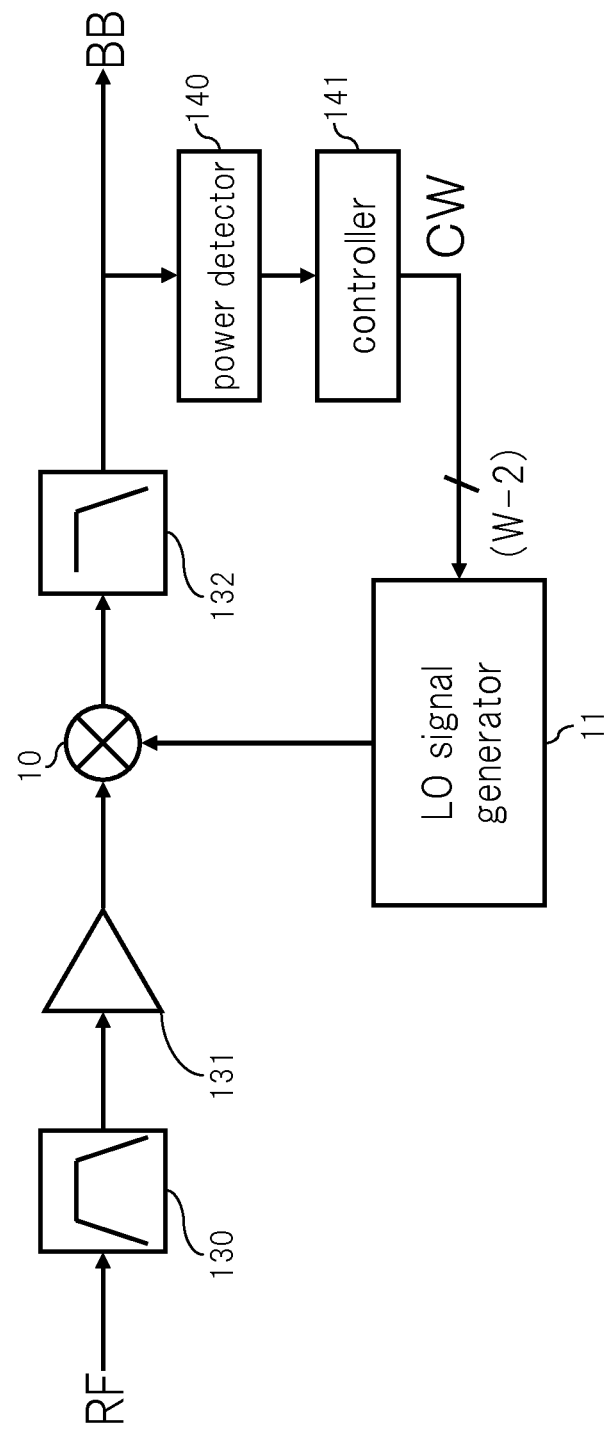
FIG. 17 is a schematic diagram showing the structure of a receiver according to a seventh exemplary embodiment of the present invention.

FIG. 17 shows the structure of a receiver according to a seventh exemplary embodiment of the present invention. The receiver according to this exemplary embodiment is different from the receiver according to the sixth exemplary embodiment in that power detector 140 that detects power of an output signal of channel pass filter 132, and controller 141 that controls control word CW that is input to LO signal generator 11 are also provided. Controller 141 sweeps LO frequencies in the usable bandwidth (pass bandwidth of band pass filter 130) of the receiver before starting communication so as to detect the radio field intensity distribution that represents the power of the output signal of channel pass filter 132 for each LO frequency and controls a phase resolution of LO signal generator 11 based on the detected radio field intensity distribution.

Next, the operation of the receiver according to this exemplary embodiment will be described with the numerical example of the first exemplary embodiment.

Even if frequencies three times and five times higher than the LO frequency lie in the usable bandwidth of the receiver, if it is known that the radio field intensities of interference signals that have such frequencies are sufficiently weak based on the radio field intensity distribution that has been detected before starting communication, with CW=8, the desired signal can be demodulated. In other words, a coarse phase resolution can be designated for LO signal generator 11. Thus, the current consumption for signals oscillated by variable frequency oscillator 40 can be suppressed. Likewise, with W=4 or 2, even if harmonics of the LO signal occur in the usable bandwidth of the receiver, CW can be increased depending on the frequency and radio field intensity so as to designate a coarse phase resolution. Controller 141 decides and controls a phase resolution necessary for LO signal generator 11 corresponding to both the LO frequency and the radio field intensity distribution. Thus, controller 141 also serves as the function of frequency and phase controller 48 shown in FIG. 7B (FIG. 17 does not show a frequency control signal that serves to control variable frequency oscillator 40). In addition, the receiver according to this exemplary embodiment can be applied to a cognitive radio that detects a radio field intensity distribution and that communicates using a non-used bandwidth based on the detected radio field intensity distribution.

(8) Eighth Exemplary Embodiment

Figure 18:
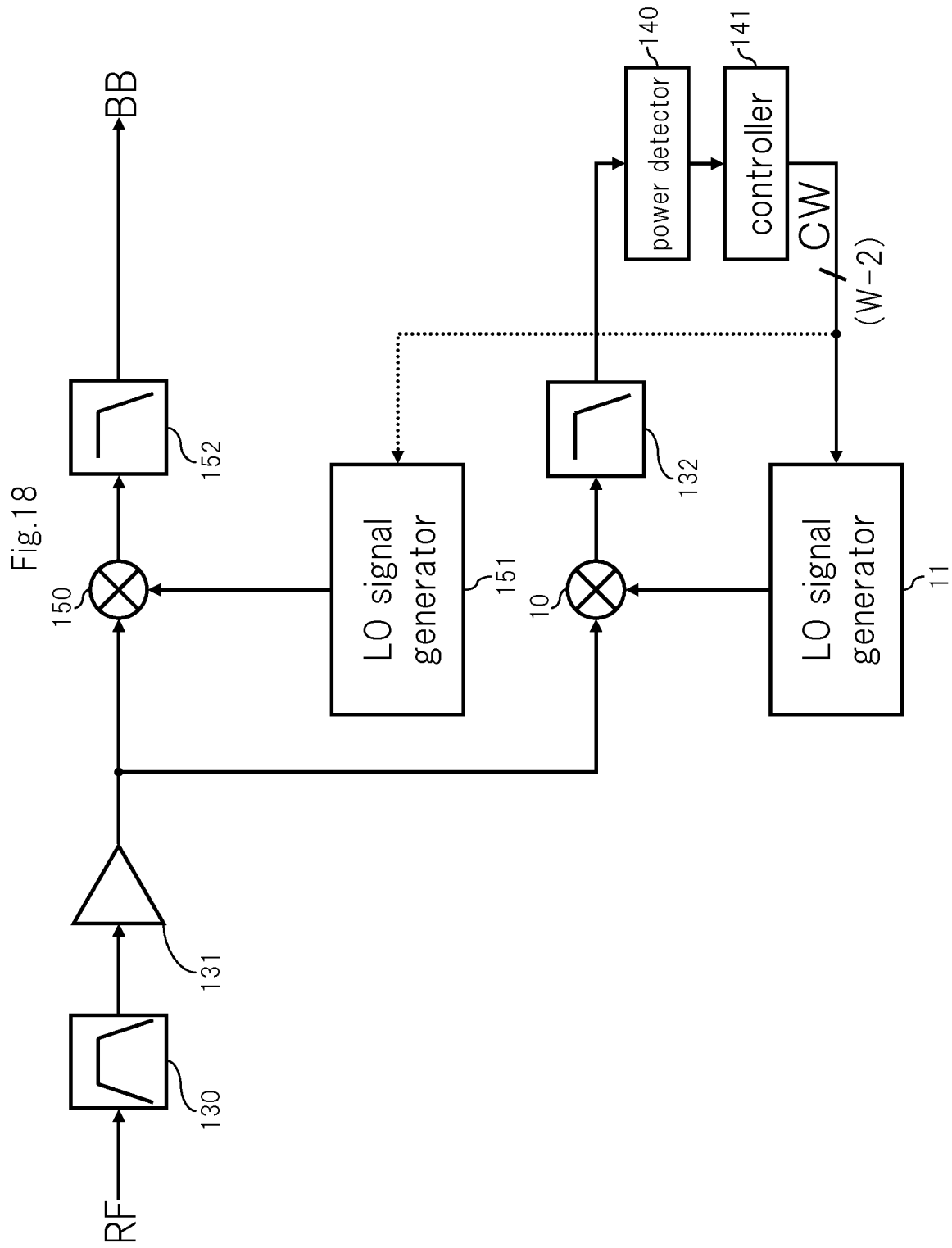
FIG. 18 is a schematic diagram showing the structure of a receiver according to an eighth exemplary embodiment of the present invention.

FIG. 18 shows the structure of a receiver according to an eighth exemplary embodiment of the present invention. The receiver according to this exemplary embodiment is different from the receiver according to the seventh exemplary embodiment in that mixer 150, LO signal generator 151, and channel pass filter 152 are also provided. In the structure of the receiver according to this exemplary embodiment, since the frequencies of LO signal generator 11 can be swept during communication along with the fixed LO frequency of LO signal generator 151, the radio field intensity distribution of the usable bandwidth of the receiver can be detected during communication. A signal (dotted line) that is input from controller 141 to LO signal generator 151 denotes that CW is updated based on the radio field intensity distribution of the usable bandwidth of the receiver (FIG. 18 does not show a frequency conversion signal that serves to control variable frequency oscillator 40). Thus, an optimum phase resolution can be designated based on a radio field intensity distribution that chronologically varies during communication.

Part or all of the foregoing exemplary embodiments may be described as the following supplementary notes, but not limited thereto.

(Supplementary Note 1)

A frequency converter used for a receiver, comprising:

an LO signal generator that generates an LO signal and outputs the LO signal; and a mixer that multiplies a received signal that has been band-limited to a usable bandwidth of said receiver by the LO signal so as to convert the frequency of the received signal and outputs the resultant signal, wherein said LO signal generator is capable of varying a phase resolution.

(Supplementary Note 2)

The frequency converter as set forth in supplementary note 1, wherein the phase resolution of said LO signal generator is decided corresponding to the LO frequency of the LO signal.

(Supplementary Note 3)

The frequency converter as set forth in supplementary note 2, wherein if up to $(2N_0-3)$-th order harmonics of the LO signal lie in said usable bandwidth, the phase resolution of said LO signal generator is 180/N where N is any integer equal to or greater than $N_0$.

(Supplementary Note 4)

The frequency converter as set forth in supplementary note 3, wherein said N is a power of 2.

(Supplementary Note 5)

The frequency converter as set forth in any one of supplementary notes 1 to 4,
wherein said LO signal generator includes:
a variable frequency oscillator;
a phase counter that outputs a phase value corresponding to an output signal of said variable frequency oscillator and a control signal that serves to vary the phase resolution of said LO signal generator; and
a phase-to-amplitude value converter that converts the phase value that is output from said phase counter into an amplitude value corresponding to the phase value and outputs the converted amplitude value that is the LO signal to said mixer.

(Supplementary Note 6)
The frequency converter as set forth in supplementary note 5,
wherein said phase counter includes:
a counter that performs a counting operation in synchronization with the output signal of said variable frequency oscillator and outputs the counted result; and
a multiplying unit that multiplies the counted result that is output from said counter by said control signal and outputs the multiplied result that is said phase value to said phase-to-amplitude value converter.

(Supplementary Note 7)
The frequency converter as set forth in supplementary note 6,
wherein said multiplying unit is a bit shift unit.

(Supplementary Note 8)
The frequency converter as set forth in supplementary note 5,
wherein said phase counter includes:
a counter whose bits vary corresponding to said control signal, and
wherein said counter performs the counting operation in synchronization with the output signal of said variable frequency oscillator and outputs the counted result that is said phase value to said phase-to-amplitude value converter.

(Supplementary Note 9)
The frequency converter as set forth in supplementary note 5,
wherein said phase counter includes:
an adding unit that adds the phase value that is output from said phase counter and said control signal and outputs the added result; and
a delaying unit that delays the added result that is output from said adding unit in synchronization with the output signal of said variable frequency oscillator and outputs the resultant signal that is said phase value to said phase-to-amplitude value converter.

(Supplementary Note 10)
The frequency converter as set forth in any one of supplementary notes 5 to 9,
wherein said phase-to-amplitude value converter includes:
a lookup table that converts the phase value that is output from said phase counter into a digital amplitude value corresponding to the phase value; and
a digital-to-analog converter that converts the amplitude value that is a digital value and that is output from said lookup table into an analog value and outputs the analog amplitude value that is the LO signal to said mixer.

(Supplementary Note 11)
The frequency converter as set forth in supplementary note 10,
wherein said phase-to-amplitude value converter further includes:
a filter located downstream of said digital-to-analog converter.

(Supplementary Note 12)
The frequency converter as set forth in any one of supplementary notes 5 to 11,
wherein said amplitude value is a sine value or a cosine value.

(Supplementary Note 13)
The frequency converter as set forth in any one of supplementary notes 1 to 4,
wherein said LO signal generator includes:
a variable frequency oscillator;
a phase counter that outputs the phase value corresponding to the output signal of said variable frequency oscillator and the control signal that serves to vary the phase resolution of said LO signal generator; and
a plurality of discrete match detectors that output a binary discrete LO signal to said mixer if they detect that the phase value that is output from said phase counter matches a predetermined phase value, and
wherein said mixer includes:
a plurality of discrete mixers that are located corresponding to said plurality of discrete match detectors and that multiply a discrete LO signal that is output from a corresponding discrete match detector by the received signal, weight the multiplied result with a predetermined gain and output the result; and
an adding unit that adds the weighted multiplied results that are output from said plurality of discrete mixers and outputs the added result.

(Supplementary Note 14)
The frequency converter as set forth in supplementary note 13,
wherein the predetermined gains designated to said discrete mixers are values proportional to cosine values or sine values that correspond to phases of discrete LO signals and that are output from the corresponding discrete match detectors.

(Supplementary Note 15)
A receiver, comprising:
a frequency converter as set forth in any one of supplementary notes 1 to 14; and
a band pass filter that is located upstream of said frequency converter and that limits the bandwidth of the received signal to said usable bandwidth.

(Supplementary Note 16)
The receiver as set forth in supplementary note 15, further comprising:
a channel pass filter that eliminates an interference signal having a frequency in the neighborhood of the frequency of a desired signal from an output signal of said frequency converter;
a power detector that detects power of the output signal of said channel pass filter; and
a controller that controls the phase resolution of said LO signal generator corresponding to power of the output signal of said channel pass filter for each LO frequency, the power being obtained by sweeping the LO frequency of the LO signal of said LO signal generator.

(Supplementary Note 17)
The receiver as set forth in supplementary note 16,
wherein said receiver includes at least two said frequency converters and at least two said channel pass filters.

With reference to the exemplary embodiments, the present invention has been described. However, it should be understood by those skilled in the art that the structure and details of the present invention may be changed in various manners without departing from the scope of the present invention.

The present application claims a priority based on Japanese Patent Application JP 2010-147496 filed on Jun. 29, 2010, the entire contents of which are incorporated herein by reference in its entirety.

What is claimed is:

1. A frequency converter used for a receiver, the frequency converter comprising:
   a local oscillation (LO) signal generator that generates an LO signal and outputs the LO signal; and
   a mixer that multiplies a received signal that has been band-limited to a usable bandwidth of said receiver by the LO signal so as to convert the frequency of the received signal and outputs the resultant signal,
   wherein said LO signal generator is capable of varying a phase resolution, and
   for some real number $N_0$, if up to $(2N_0-3)$-th order harmonics of the LO signal lie in said usable bandwidth, the phase resolution of said LO signal generator is 180/N where N is any integer equal to or greater than N0.

2. The frequency converter as set forth in claim 1, wherein said N is a power of 2.

3. The frequency converter as set forth in claim 1,
   wherein said LO signal generator includes:
   a variable frequency oscillator;
   a phase counter that outputs a phase value corresponding to an output signal of said variable frequency oscillator and a control signal that serves to vary the phase resolution of said LO signal generator; and
   a phase-to-amplitude value converter that converts the phase value that is output from said phase counter into an amplitude value corresponding to the phase value and outputs the converted amplitude value that is the LO signal to said mixer.

4. The frequency converter as set forth in claim 3,
   wherein said phase counter includes:
   a counter that performs a counting operation in synchronization with the output signal of said variable frequency oscillator and outputs the counted result; and
   a multiplying unit that multiplies the counted result that is output from said counter by said control signal and outputs the multiplied result that is said phase value to said phase-to-amplitude value converter.

5. The frequency converter as set forth in claim 3,
   wherein said phase counter includes:
   a counter whose bits vary corresponding to said control signal, and
   wherein said counter performs the counting operation in synchronization with the output signal of said variable frequency oscillator and outputs the counted result that is said phase value to said phase-to-amplitude value converter.

6. The frequency converter as set forth in claim 3,
   wherein said phase counter includes:
   an adding unit that adds the phase value that is output from said phase counter and said control signal and outputs the added result; and
   a delaying unit that delays the added result that is output from said adding unit in synchronization with the output signal of said variable frequency oscillator and outputs the resultant signal that is said phase value to said phase-to-amplitude value converter.

7. The frequency converter as set forth in claim 3,
   wherein said phase-to-amplitude value converter includes:
   a lookup table that converts the phase value that is output from said phase counter into a digital amplitude value corresponding to the phase value; and
   a digital-to-analog converter that converts the amplitude value that is a digital value and that is output from said lookup table into an analog value and outputs the analog amplitude value that is the LO signal to said mixer.

8. The frequency converter as set forth in claim 1,
   wherein said LO signal generator includes:
   a variable frequency oscillator;
   a phase counter that outputs the phase value corresponding to the output signal of said variable frequency oscillator and the control signal that serves to vary the phase resolution of said LO signal generator; and
   a plurality of discrete match detectors that output a binary discrete LO signal to said mixer if they detect that the phase value that is output from said phase counter matches a predetermined phase value, and
   wherein said mixer includes:
   a plurality of discrete mixers that are located corresponding to said plurality of discrete match detectors and that multiply a discrete LO signal that is output from a corresponding discrete match detector by the received signal, weight the multiplied result with a predetermined gain and output the result; and
   an adding unit that adds the weighted multiplied results that are output from said plurality of discrete mixers and outputs the added result.

9. A receiver, comprising:
   a frequency converter as set forth in claim 1; and
   a band pass filter that is located upstream of said frequency converter and that limits the bandwidth of the received signal to said usable bandwidth.

* * * * *